United States Patent
Schmitt

(10) Patent No.: US 11,280,639 B2
(45) Date of Patent: Mar. 22, 2022

(54) MULTITURN SENSOR ARRANGEMENT AND READOUT

(71) Applicant: Analog Devices International Unlimited Company, Limerick (IE)

(72) Inventor: Jochen Schmitt, Biedenkopf (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/021,469

(22) Filed: Sep. 15, 2020

(65) Prior Publication Data
US 2020/0408567 A1  Dec. 31, 2020

Related U.S. Application Data

(62) Division of application No. 15/064,544, filed on Mar. 8, 2016, now Pat. No. 10,782,153.

(51) Int. Cl.
*G01D 5/16* (2006.01)

(52) U.S. Cl.
CPC ..................................... *G01D 5/16* (2013.01)

(58) Field of Classification Search
CPC .... G01D 5/16; G01D 5/2449; G01D 5/24476; G01D 5/145; G11C 7/1006; G11C 29/50; G11C 11/15; G11C 11/1673; G11C 27/02; G11C 11/1675; G11C 7/106; G11C 7/24; G11C 7/1087; G11C 7/1051; G11C 7/1078; G11C 16/12; G11C 16/3459; G11C 11/5628; G11C 29/04; G11C 16/0483; G01R 33/0035; G01R 33/093; H03M 3/32; H03M 3/39; H03M 3/43; H03M 3/496; H03M 3/456; G06F 12/0893; G06F 12/0862; G01B 7/30; G01P 3/487

USPC .......... 365/158, 209, 185.15, 148, 171, 173, 365/208, 200; 324/202; 341/143
See application file for complete search history.

(56) References Cited

U.S. PATENT DOCUMENTS

| | | | |
|---|---|---|---|
| 2,695,992 A | 11/1954 | Winger et al. |
| 3,281,787 A | 10/1966 | Trimble |
| 3,373,406 A | 3/1968 | Cannon et al. |
| 3,393,449 A | 7/1968 | Garcia |

(Continued)

FOREIGN PATENT DOCUMENTS

| | | |
|---|---|---|
| AT | 364167 | 6/2007 |
| CN | 1695044 | 11/2005 |

(Continued)

OTHER PUBLICATIONS

Diegel, M. et al., QUAD16: the new generation of Multiturn Sensors, pp. 73-77, MR-Symposium 2009, Institute for Photonic Technology (IPHT), Jena, 2009.

(Continued)

*Primary Examiner* — Mouloucoulaye Inoussa
(74) *Attorney, Agent, or Firm* — Knobbe, Martens, Olson & Bear, LLP

(57) ABSTRACT

A system includes a multiturn counter that can store a magnetic state associated with a number of accumulated turns of a magnetic field. The multiturn counter includes a plurality of magnetoresistive elements electrically coupled in series with each other. A matrix of electrical connections is arranged to connect magnetoresistive elements of the plurality of magnetoresistive elements to other magnetoresistive elements of the plurality of magnetoresistive elements.

20 Claims, 22 Drawing Sheets

(56) References Cited

U.S. PATENT DOCUMENTS

| | | |
|---|---|---|
| 3,482,239 A | 12/1969 | Yanishevsky |
| 5,175,114 A | 12/1992 | Ono et al. |
| 5,475,304 A | 12/1995 | Prinz |
| 5,550,598 A | 8/1996 | Itoh et al. |
| 5,650,834 A | 7/1997 | Nakagawa et al. |
| 5,883,763 A | 3/1999 | Yuan et al. |
| 5,920,446 A | 7/1999 | Gill |
| 5,952,825 A | 9/1999 | Wan |
| 6,037,776 A | 3/2000 | McGlone |
| 6,081,759 A | 6/2000 | Husby et al. |
| 6,141,625 A | 10/2000 | Smith et al. |
| 6,292,336 B1 | 9/2001 | Horng et al. |
| 6,507,272 B1 | 1/2003 | Nicholson et al. |
| 6,686,068 B2 | 2/2004 | Carey et al. |
| 6,738,236 B1 | 5/2004 | Mao et al. |
| 6,834,017 B2 | 12/2004 | Perner |
| 6,853,306 B1 | 2/2005 | Nitschke et al. |
| 6,927,566 B2 | 8/2005 | Apel et al. |
| 7,116,576 B2 | 10/2006 | Smith |
| 7,239,131 B2 | 9/2007 | Halder et al. |
| 7,312,609 B2 | 12/2007 | Schmollngruber et al. |
| 7,345,854 B2 | 3/2008 | Takano |
| 7,372,753 B1 | 5/2008 | Rinerson et al. |
| 7,671,583 B2 | 3/2010 | Diegel et al. |
| 7,936,539 B2 | 5/2011 | Horng et al. |
| 8,000,597 B2 | 8/2011 | Takeya |
| 8,111,401 B2 | 2/2012 | Magnusson et al. |
| 8,179,130 B2 | 5/2012 | Mattheis |
| 8,217,809 B2 | 7/2012 | Westhues et al. |
| 8,649,202 B2 | 2/2014 | Sakaguchi |
| 8,706,432 B2 | 4/2014 | Dietz |
| 8,743,511 B2 | 6/2014 | Childress et al. |
| 10,782,153 B2 | 9/2020 | Schmitt |
| 2004/0047179 A1* | 3/2004 | Tanizaki ............ G11C 11/15 365/171 |
| 2004/0066690 A1 | 4/2004 | Perner et al. |
| 2005/0013181 A1* | 1/2005 | Adelmann ............ G11C 7/106 365/200 |
| 2005/0041517 A1 | 2/2005 | Smith et al. |
| 2005/0237054 A1 | 10/2005 | Halder et al. |
| 2007/0285087 A1 | 12/2007 | Diegel et al. |
| 2010/0066572 A1 | 3/2010 | Dietz et al. |
| 2010/0104275 A1 | 4/2010 | Takeya et al. |
| 2010/0177058 A1 | 7/2010 | Lin |
| 2010/0248973 A1 | 9/2010 | Van Lankvelt et al. |
| 2010/0301842 A1 | 12/2010 | Mattheis |
| 2011/0286261 A1 | 11/2011 | Sakaguchi et al. |
| 2012/0140208 A1 | 6/2012 | Magnusson et al. |
| 2013/0300409 A1 | 11/2013 | Deak et al. |
| 2014/0099663 A1 | 4/2014 | Wang et al. |
| 2014/0191795 A1 | 7/2014 | Huang et al. |
| 2016/0104519 A1* | 4/2016 | Slaughter ............ G11C 29/006 365/158 |
| 2016/0148695 A1* | 5/2016 | Kim ............ G11C 29/42 365/185.03 |
| 2017/0261345 A1 | 9/2017 | Schmitt |
| 2018/0172477 A1* | 6/2018 | Dietrich ............ G01D 5/16 |
| 2018/0356252 A1 | 12/2018 | Diegel et al. |
| 2018/0372510 A1* | 12/2018 | Mattheis ............ G01R 33/093 |
| 2020/0300938 A1 | 9/2020 | Schmitt et al. |

FOREIGN PATENT DOCUMENTS

| | | |
|---|---|---|
| CN | 1918477 A | 2/2007 |
| CN | 101836087 | 9/2010 |
| DE | 10239904 | 8/2004 |
| DE | 102004020149 | 11/2005 |
| DE | 102006039490 | 3/2008 |
| DE | 102008037975 | 3/2009 |
| DE | 102008063226 | 7/2010 |
| DE | 102010010893 | 9/2010 |
| DE | 102010022611 | 12/2011 |
| DE | 112010000890 T5 | 9/2012 |
| DE | 102011075306 | 11/2012 |
| DE | 102011080050 | 1/2013 |
| DE | 102013018680 | 5/2015 |
| DE | 102015210585 A1 | 12/2016 |
| DE | 102015210586 | 12/2016 |
| DE | 112016005622 | 11/2018 |
| EP | 0449226 | 10/1991 |
| EP | 0791899 | 5/2005 |
| EP | 1740909 | 6/2007 |
| EP | 1532425 | 9/2007 |
| EP | 2191237 | 6/2010 |
| EP | 2667213 | 11/2013 |
| EP | 2059789 | 7/2015 |
| JP | S63-75618 | 4/1988 |
| JP | H 0431537 B2 | 5/1992 |
| JP | 2005536758 | 12/2005 |
| JP | 2008-166507 | 7/2008 |
| JP | 5566776 B2 | 8/2014 |
| WO | WO2004020952 | 3/2004 |
| WO | WO2005106395 | 11/2005 |
| WO | WO 2009/014027 | 1/2009 |
| WO | WO2009027046 | 3/2009 |
| WO | WO2015062573 | 5/2015 |
| WO | WO2016/198062 | 12/2016 |

OTHER PUBLICATIONS

How to Substantially Reduce Encoder Cost While Gaining Functionality with Multi-Turn Rotary Position Sensors, White Paper, novotechnik Siedle Group. Apr. 4, 2009.

Mattheis, et al., Multiturn Counter Using the Movement and Storage of 180° Magnetic Domain Walls, IEEE Transactions on Magnetics, vol. 42, No. 10, Oct. 2006, pp. 3297-3299.

Weiss et al., Advanced Giant Magnetoresistance Technology for Measurement Applications, IOP Publishing, Measurement Science and Technology 24 (2013) 17 pages.

Diegel, et al., A New Four Bit Magnetic Domain Wall Based Multiturn Counter, IEEE Transactions on Magnetics, vol. 45, No. 10, Oct. 2009.

Japanese Office Action from related App. No. JP 2017-042571 dated Mar. 5, 2018.

Japanese Office Action from related App. No. JP 2017-042571 dated Mar. 4, 2019.

Diegel, M. et al. Multiturn Counter Using Movement and Storage of 180° Magnetic Domain Walls, Sensor Letters, vol. 5, pp. 118-122 (2007).

* cited by examiner

MULTITURN SENSOR ARRANGEMENT AND READOUT

RELATED APPLICATION

This application is a divisional of U.S. patent application Ser. No. 15/064,544, filed Mar. 8, 2016, the disclosure of which is hereby incorporated by reference in its entirety herein.

TECHNOLOGICAL FIELD

This application relates to sensors, and more particularly, to multiturn sensors such as giant magnetoresistance multiturn sensors.

BACKGROUND

A multiturn counter can keep track of how many times an apparatus or element thereof has been turned. This can be implemented using an electromagnetic system. Electromagnetic multiturn sensors can include electrical multiturn sensors, magnetic multiturn sensors, and multiturn sensors that use both electrical and magnetic principles. An example of electromagnetic multiturn sensor includes a giant magnetoresistance (GMR) sensor.

Multiturn counters have a variety of uses. Electronic implementations of multiturn counters can translate a physical position or motion into an electromagnetic representation suitable for processing. For example, drive-by-wire cars can use a multiturn counter to track how many times a steering wheel has been turned. This, for example, allows a vehicle control system to differentiate between when a steering wheel is at 45 degrees or 405 degrees, despite the steering wheel being in the same position at both angles.

Multiturn sensors can be implemented using multiple Wheatstone bridges as sensing circuits, multiple sensor outputs, and numerous internal interconnections to detect voltages. These multiturn sensors can include a relatively large number of more sensors and sensor outputs as the number of countable turns increases.

SUMMARY OF CERTAIN INVENTIVE ASPECTS

One aspect of this disclosure is a system that includes a multiturn counter configured to store a magnetic state associated with a number of accumulated turns of a magnetic field. The multiturn counter is configured to count at least two turns, and the multiturn counter includes a plurality of magnetoresistive elements electrically coupled in series with each other, the plurality of magnetoresistive elements comprising at least eight magnetoresistive elements. The multiturn counter also includes a matrix of electrical connections arranged to electrically connect magnetoresistive elements of the plurality of magnetoresistive elements to other magnetoresistive elements of the plurality of magnetoresistive elements, the matrix being at least three by three.

In the system, the plurality of magnetoresistive elements can be part of a magnetic strip that is physically laid out in the shape of a spiral.

The system can also include a sensing circuit configured to sense a sequence of properties of the plurality of magnetoresistive elements and also configured to provide an output indicative of the number of accumulated turns of the magnetic field, and a driving circuit configured to apply combinations of voltages or currents to the matrix of electrical connections in a sequence, thereby enabling the sensing circuit to sense the sequence of properties.

The a sensing circuit can include a first sample and hold circuit configured to sample at a first time, a second sample and hold circuit configured to sample at a second time that is different from the first time, and a comparator configured to compare an output of the first sample and hold circuit with an output of the second sample and hold circuit.

The system can also include a magnet positioned within a distance close enough to cause the domain wall generator to change domain walls in the plurality of magnetoresistive elements, thereby changing a resistance of at least one of the magnetically magnetoresistive elements in response to the magnet rotating 180 degrees.

In the system, the multiturn counter can further include a domain wall generator coupled to one end of the plurality of magnetoresistive elements, the domain wall generator configured to generate a domain wall at a corner in the magnetic strip, thereby causing a magnetoresistive element to change resistances.

In the system, the multiturn counter can be configured to count N turns. The system can also include a number of sensing circuits, the number being less than 2 times N and a plurality of switches is configured to electrically couple an individual magnetoresistive element to an individual sensing circuit of the number of sensing circuits.

In the system, the spiral has can have N magnetoresistive elements, where N is greater than or equal to 8. The spiral can have R physical connections to rows of electrical connections of the matrix of electrical connections. The spiral can have C physical connections to columns of electrical connections of the matrix of electrical connections. The following equations can be satisfied: $N<(R+1)*(C+1)$; and $N>(R-1)*(C-1)$. Both C and R can be 3 or greater.

Another aspect of this disclosure is directed to a giant magnetoresistance (GMR) sensor. The GMR sensor includes a magnetic strip comprising magnetoresistive elements electrically coupled in series with each other, the magnetic strip having a spiral shaped layout, and each of the magnetoresistive elements of the magnetic strip having at least two states associated with different resistances. The GMR sensor also includes a matrix of electrical connections electrically coupled to a plurality of nodes along the magnetic strip, the matrix being at least two by two and comprising rows of electrical connections and columns of electrical connections. The GMR sensor also includes a sensing circuit electrically coupled to the matrix of electrical connections, the sensing circuit configured to determine a state of a selected magnetoresistive element of the plurality of magnetoresistive elements.

The GMR sensor can also include a driving circuit configured to sequentially supply power through different combinations of electrical connections in the matrix of electrical connections, and provide a sequence of electromagnetic readings from which a cumulative turn state is determinable.

The driving circuit of the GMR sensor can also include row switches configured to selectively electrically couple a first signal reference to a selected row of the rows of electrical connections. The driving circuit of the GMR sensor can also include column switches configured to selectively electrically couple a second signal reference to a selected column of the columns of electrical connections. The column switches can be configured to selectively electrically couple the sensing circuit to the selected column of the columns of electrical connections.

In the GMR sensor, the sequence of combinations can include combinations that cause power to be provided to a sequence of individual magnetoresistive elements.

The GMR sensor can also include an amplifier configured to output an analog signal, an analog to digital converter configured to convert the analog signal into a digital signal, and a digital comparator configured to compare a first digital value of the digital signal with a second digital value.

In the GMR sensor, the spiral can have N resistive segments and 2N+2 or fewer than physical connections with the matrix.

Another aspect of this disclosure is directed to a method for reading a state of a giant magnetoresistance (GMR) sensor. The method includes powering a first sequence of rows in a matrix, the rows being coupled to a strip of a plurality of magnetoresistive elements. The method includes powering a second sequence of columns in a matrix, the columns being coupled to the strip of the plurality of magnetoresistive elements. The method includes sensing a sequence of electromagnetic properties of individual magnetoresistive elements of the plurality of magnetoresistive elements. The strip of magnetoresistive elements is physically laid out as a spiral. The strip includes strip corners. The strip also includes strip sides that have a variable resistance. The plurality of magnetoresistive elements includes the sides.

In the method, powering the first sequence of rows in the matrix and powering the second sequence of columns in the matrix can be performed such that the guarding principle enables the sensing of the electromagnetic properties of the individual magnetoresistive elements of the plurality of magnetoresistive elements.

In the method, powering the first sequence can include providing a current source to a first row while grounding a second row and also include providing a current source to the second row while grounding the first row. Powering the second sequence can include providing the current source to a first column and subsequently providing the current source to a second column.

The method can also include sampling and holding a first voltage across a first magnetoresistive element of the plurality of magnetoresistive elements. The method can also include sampling and holding a second voltage across a second magnetoresistive element of the plurality of magnetoresistive elements. The method can also include comparing the first voltage to the second voltage.

The method can also include generating a domain wall at a corner in the strip

The method can also include determining a number of turns of a magnetic field permeating a domain wall generator with 180 degree accuracy, the determining comprising decoding a series of sensed voltages.

For purposes of summarizing the disclosure, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

BRIEF DESCRIPTION OF THE DRAWINGS

FIG. 10 shows the example 2 turn counter of FIG. 9 in a starting state at 0 degrees.

FIG. 11 shows the example 2 turn counter of FIG. 9 in a state where the magnetic field has rotated clockwise 90 degrees.

FIG. 12 shows the example 2 turn counter of FIG. 9 in a state where the magnetic field has rotated clockwise 180 degrees.

FIG. 13 shows the example 2 turn counter of FIG. 9 in a state where the magnetic field has rotated clockwise 270 degrees.

FIG. 14 shows the example 2 turn counter of FIG. 9 in a state where the magnetic field has rotated clockwise 360 degrees.

FIG. 15 shows the example 2 turn counter of FIG. 9 in a state where the magnetic field has rotated clockwise 450 degrees.

FIG. 16 shows the example 2 turn counter of FIG. 9 in a state where the magnetic field has rotated clockwise 540 degrees.

FIG. 17 shows the example 2 turn counter of FIG. 9 in a state where the magnetic field has rotated clockwise 630 degrees.

FIG. 18 shows the example 2 turn counter of FIG. 9 in a state where the magnetic field has rotated clockwise 720 degrees.

FIG. 19 shows the example 2 turn counter of FIG. 15 in a state where the magnetic field has rotated counterclockwise 90 degrees to have an accumulated rotation of 360 degrees.

FIG. 20 shows the example 2 turn counter of FIG. 19 in a state where the magnetic field has rotated counterclockwise 90 degrees to have an accumulated rotation of 270 degrees.

DETAILED DESCRIPTION OF CERTAIN EMBODIMENTS

Figure 1:
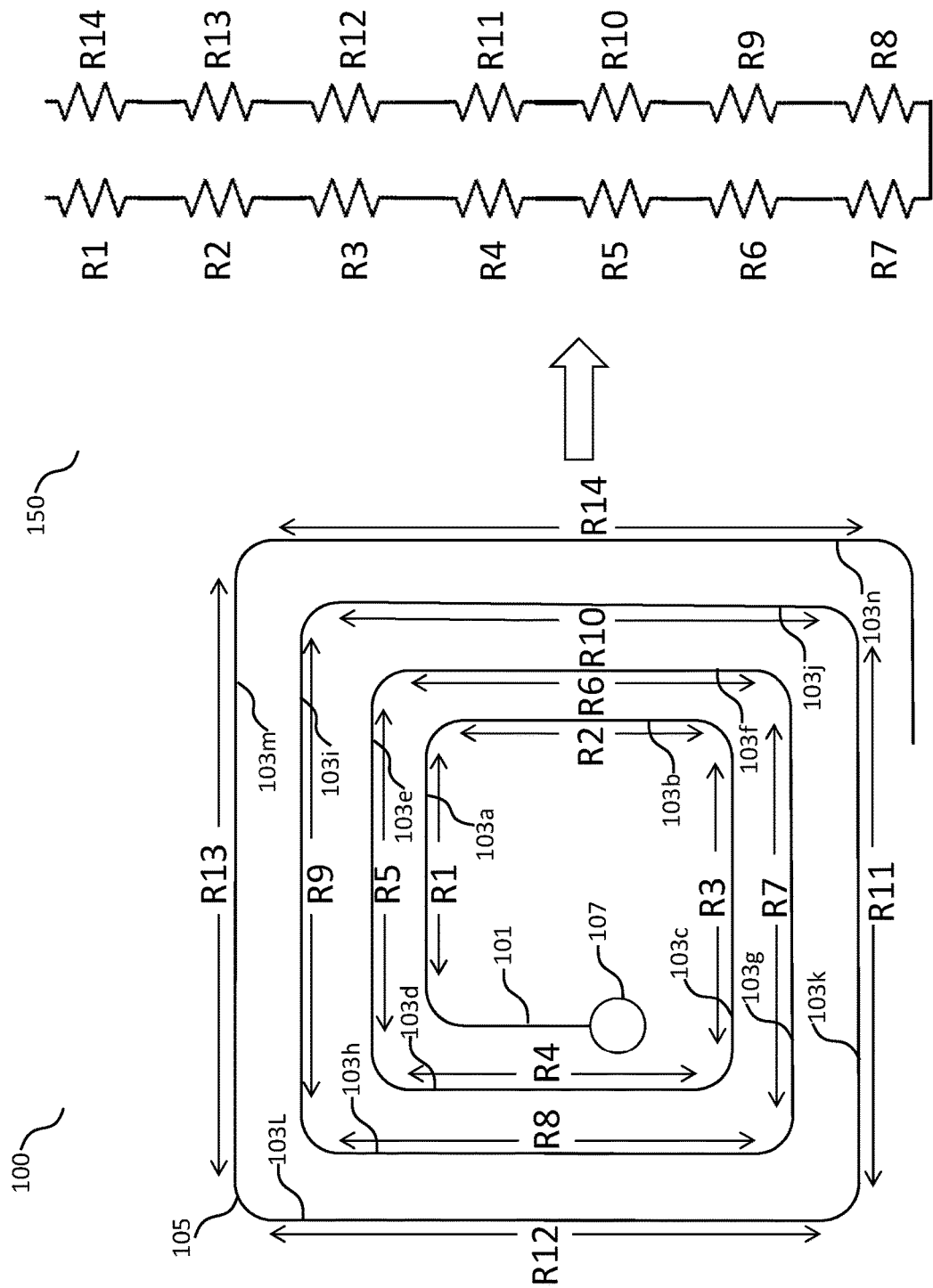
FIG. 1 shows an example magnetic strip layout representation with a corresponding circuit schematic representation.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, multiturn sensors can be implemented using multiple Wheatstone bridges as sensing circuits, multiple sensor outputs, and numerous internal interconnections to detect voltages. These multiturn sensors include more sensors, more sensor outputs, and more complicated internal connections as the number of countable turns increases. The additional outputs and sensors can increase linearly with the number of countable turns. The Wheatstone bridges, sensor outputs, and internal interconnections can consume a relatively large amount of die area. The multiturn sensors that use Wheatstone bridges can have twice as many sensor outputs as the number of turns that the multiturn sensor is designed to count. For example, a 16 turn sensor can require 32 sensor outputs. As a result, multiturn sensors designed to count many turns can require a large die area for the Wheatstone bridge circuits and outputs. In multiturn sensors that use multiple voltage supplies and tie outputs together in an effort to reduce die area, the output signal can be reduced significantly. Reduced output signals can involve more sensitive signal detectors and other circuitry.

In some embodiments, a multiturn counter is physically laid out as a spiral track coupled to a domain wall generator. A matrix of connections creates relatively short connections between different segments of the spiral track. A driving circuit and a sensing circuit are coupled to rows and columns of the matrix. A combination of switches coupled to the rows and columns of the matrix are opened and closed in a sequence so that individual resistances can be sensed. The sequence of sensed resistances can be compared and/or decoded to determine and accumulated turn state.

In some embodiments, a magnetic strip having a magnetic anisotropy is physically laid out in the shape of a spiral. A domain wall generator coupled to one end of the magnetic strip is configured to generate and transport one or more domain walls through the magnetic strip according to the orientation of a rotating magnetic field. A matrix of electrical connections, such as a logical matrix of electrical connections, can be physically implemented with the spiral shaped magnetic strip. The physical layout of the electrical connections can look different from a schematic row/column representation of the matrix. A driving circuit can activate (e.g., provide a voltage and/or current to) a portion of the spiral and a sensing circuit can make an electromagnetic reading associated with the portion of the spiral. As such, the sensing circuit can sense a resistance of an isolated magnetoresistive element of the magnetic strip. A control circuit can control a sequence in which different parts of the spiral can be powered and sensed by a sensing circuit. For instance, the control circuit can control switches to select a particular magnetoresistive element of the spiral for which the sensing circuit can sense a value indicative of resistance. The sensing circuit can make a sequence of electrical readings of the various parts of the spiral associated with magnetic states of the various parts of the spiral. In some instances, the sensing circuit can perform a comparison of the electromagnetic readings. The output of the sensing circuit can be decoded to determine an accumulated turn state of the magnetoresistive elements of the magnetic strip.

In some embodiments, the use of a matrix of electrical connections can reduce and/or minimize the electrical connections to the spiral. In some embodiments, fewer sensors are used to read out the state of the multiturn counter, thereby consuming less physical die area and reducing fabrication costs. In some embodiments, a comparator circuit can provide accurate readings over a relatively large range of temperatures.

The various embodiments of multiturn counters described in this disclosure can have one or more the following advantages, among others. The multiturn sensor can have fewer outputs compared to other designs such as designs that use Wheatstone bridges. The multiturn sensor can detect an accumulated number of turns with 180 degree resolution. The multiturn sensor can include a matrix that allows for selecting and outputting individual signals without causing signal reduction and without needing to combine signals. The multiturn sensor can use less sensitive sensors (e.g., voltmeters, ammeters, ohmmeters, or sampling circuits), a sensing circuit can measure values for individual magnetoresistive elements, fewer sensing circuits can be used, and fewer or no Wheatstone bridge circuits can be used. The multiturn sensor can allow for lower costs of production, smaller physical size, easier fabrication, and fewer interconnections. The multiturn sensor can function accurately over a relatively large temperature range. The multiturn sensor can have fewer or no voltmeters for readout and also have fewer parts. The multiturn sensor can have nonvolatile memory that can be written to even when not powered. The multiturn sensor can count a greater number of turns, have a higher turn to sensor ratio, have a higher turn to connections ratio, and have a higher turn to magnetoresistive element ratio. Wheatstone bridge circuits, sensors, and interconnections can take up die area and create complexity, so their uses can be minimized, and Wheatstone bridges can be avoided altogether. Furthermore, each magnetoresistive element can be individually measured by relatively less expensive sensing circuits, while at the same time, the number of sensing circuits and sensor outputs can remain relatively low (e.g., 1 or 2) even for large numbers of magnetoresistive elements.

FIG. 1 shows an example magnetic strip layout 100 with a corresponding circuit schematic representation 150. FIG. 1 shows a magnetic strip 101 having corners 105 and segments 103a-103n forming magnetoresistive elements R1-R14 arranged in series with each other, and a domain wall generator 107. The magnetoresistive elements can act as variable resistors that change resistances in response to a magnetic alignment state. The magnetic strip 101 illustrated in FIG. 1 can be implement in a multiturn counter that can count at least 3 turns.

The magnetic strip 101 can be a giant magnetoresistance track that is physically laid out in the shape of a spiral. As illustrated in FIG. 1, such a spiral shaped magnetic strip 101 can have rounded corners 105 and segments 103a-103n. The magnetic strip 101 can have a magnetic anisotropy, such as a high anisotropy, based on the material and cross sectional dimensions of the magnetic strip 101. The magnetic strip 101 can store magnetic energy. A domain wall generator (DWG) 107 is coupled to one end of the magnetic strip 101. The DWG 107 can have a magnetic anisotropy, such as a low anisotropy. The domain wall generator can generate domain walls in response to rotations in a magnetic field. The domain walls can be injected to the magnetic strip 101.

The segments 103a-103n of the magnetic strip 101 are shown as straight sides of the magnetic strip 101 in the example of FIG. 1. The segments 103a-103n can have a variable resistance based on the magnetic domain of the segment. As the magnetic domain of a segment changes, the resistance of that segment can change. Accordingly, the segments 103a-103n can operate as magnetoresistive elements, also referred to as variable resistors R1-R14 herein. The magnetoresistive elements R1-R14 can also function as nonvolatile, magnetic memory that can be magnetically written and electrically read. The magnetoresistive elements R1-R14, as laid out in the spiral shaped magnetic strip 101, are coupled in series with each other. Corresponding circuit schematic representation 150 shows segments 103a-103n depicted as corresponding magnetoresistive elements R1-R14 connected in series.

Figure 2:
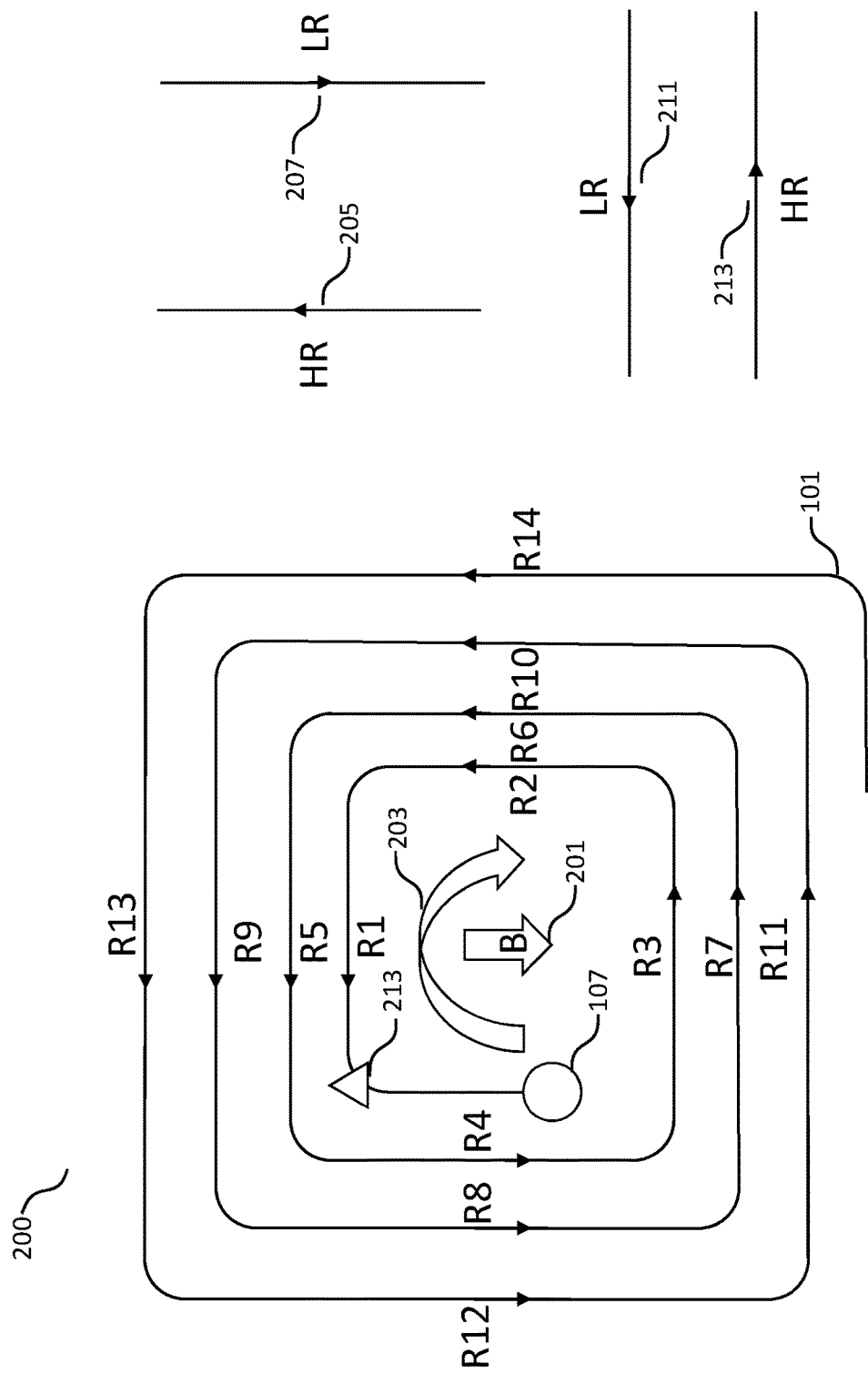
FIG. 2 shows an example magnetic strip layout representation with explanatory symbols.

FIG. 2 shows an example magnetic strip layout representation 200 with explanatory symbols. The magnetic strip 101 with magnetoresistive element segments equivalents R1-R14 of FIG. 1 is shown, along with DWG 107, an external magnetic field 201, an arrow 203 indicating a rotation of the external magnetic field 201, and a domain wall 213. Domain orientations 205, 207, 209, and 211 indicate an orientation of a domain inside of a segment of a magnetic strip.

The DWG 107 can be affected by the external magnetic field 201. As the external magnetic field 201 rotates as indicated by arrow 203, the DWG 107 can inject domain walls 213 through the magnetic strip 101. The domain wall 213 can propagate through the segments as the domain orientations 205, 207, 209, and 211 change. Although FIG. 2 and FIG. 9-20 show the external magnetic field 201 at perpendicular positions for clarity, the magnetic field can be pointed at any angle, such as a 45 degree angle toward the spiral corners.

The resistivity of segments of the magnetic strip 101 can be affected by the domain orientation within a magnetic strip segment. Each segment's domain orientation can cause that segment to have a high resistance ("H" or "HR") or a low resistance ("L" or "LR") depending on the orientation of the segment. Vertically illustrated magnetic strip segments having a domain orientation 205 have a higher resistivity than vertical magnetic strip segments having a domain orientation 207, which have a low resistivity. Horizontally illustrated magnetic strip segments having a domain orientation 213 have a higher resistivity than horizontal magnetic strip segments having a domain orientation 211, which have a low resistivity. The magnetic strip segments with domain orientations 205 and 213 can have comparable resistances. Similarly, the magnetic strip segments with domain orientations 207 and 211 can have comparable resistances.

The actual resistances can vary between different segments of the magnetic strip 101. For example, with reference to FIG. 1, segment 103b at a HR magnetic orientation can have a smaller resistance than segment 103c at a HR magnetic orientation because segment 103c is slightly longer than segment 103b. This difference can be exacerbated between the first segment and the last segment in relatively large spirals. A spiral shaped magnetic strip 101 can be relatively compact to reduce and/or minimize die area. A relatively small, compact spiral shaped magnetic strip 101 having incrementally larger segments can avoid the problem where a longer magnetic strip at low resistivity has a higher resistance than a shorter magnetic strip at a high resistivity. In some embodiments, the difference in resistivity, and not the length of the segments, is the dominating factor in the determination of the resistance of a magnetic strip segment. In some embodiments, a contact area on the arms of the spiral is placed such that each segment can have approximately the same resistance. However, due to process variations, there may be some variation in resistances among segments.

Furthermore, the resistance of each segment of the magnetic strip 101 can vary with temperature. Some embodiments can implement resistance sensors that adjust for temperature fluctuations by measuring resistances and adjusting based on, for example, a temperature reading or a change in value of a reference element. In some embodiments, the resistances of the segments can be measured and decoded, accounting for varying segment lengths and temperatures, to determine the state of the multiturn counter.

Figure 7:
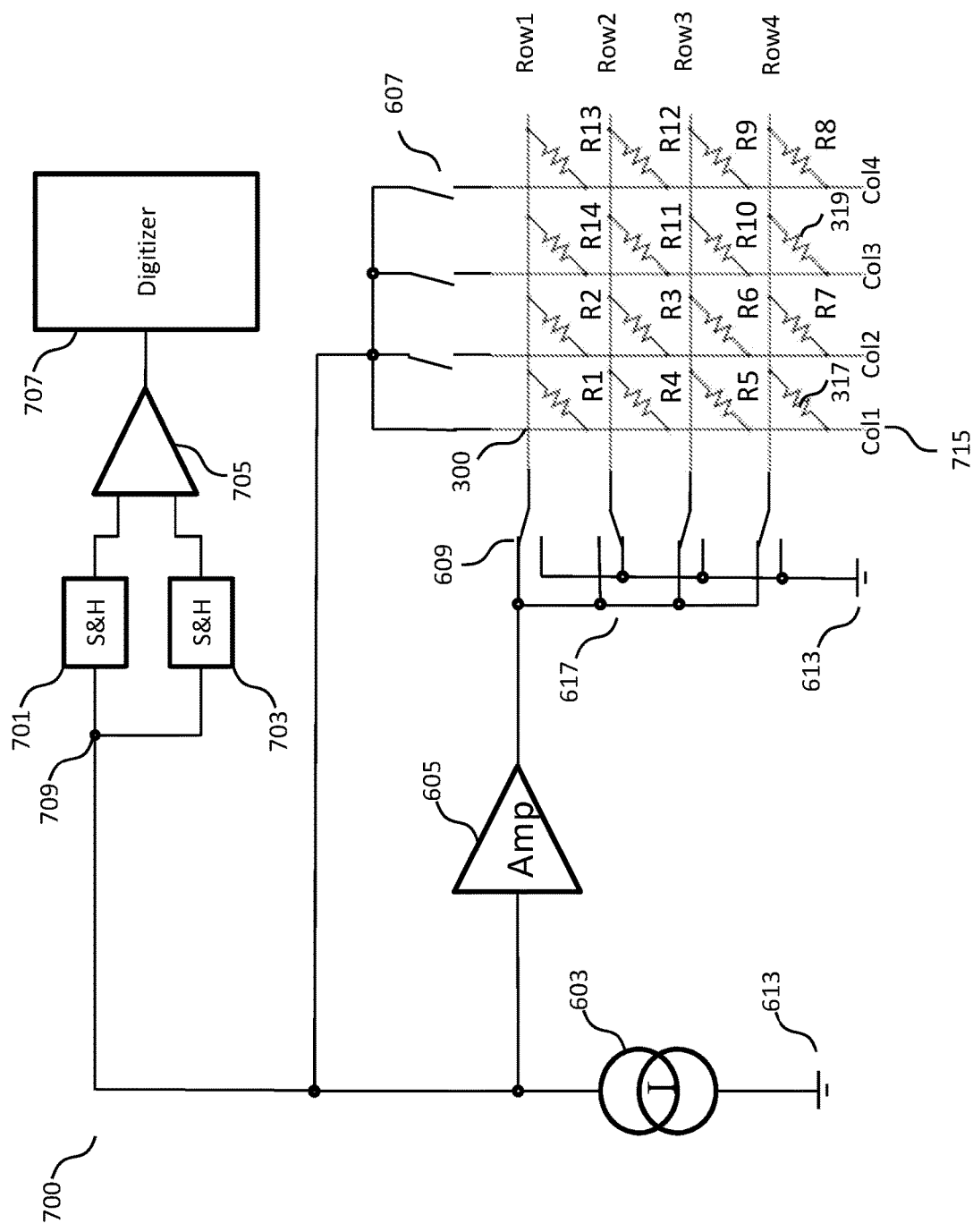
FIG. 7 shows an example schematic of a driving and sensing circuit electrically connected through a matrix of interconnects to a series of magnetoresistive elements according to an embodiment.

A comparator based sensor, such as shown in FIG. 7, can determine the state of the magnetic strip in the presence of variations in temperature without adjustments or additional temperature references. Furthermore, the comparator based sensor can be configured to compare neighboring segments such that incremental segment length differences and/or differences in resistance due to process variations can have negligible effects in determining the state of the multiturn counter.

The examples shown in FIG. 1 and FIG. 2 depict a spiral shaped magnetic strip 101 as an open spiral based on a quadrilateral. However, in some other embodiments, different polygon or elliptical spiral configurations are possible. Also, the spiral can be a closed spiral or a multi-layer spiral with overlapping parts.

Figure 3:
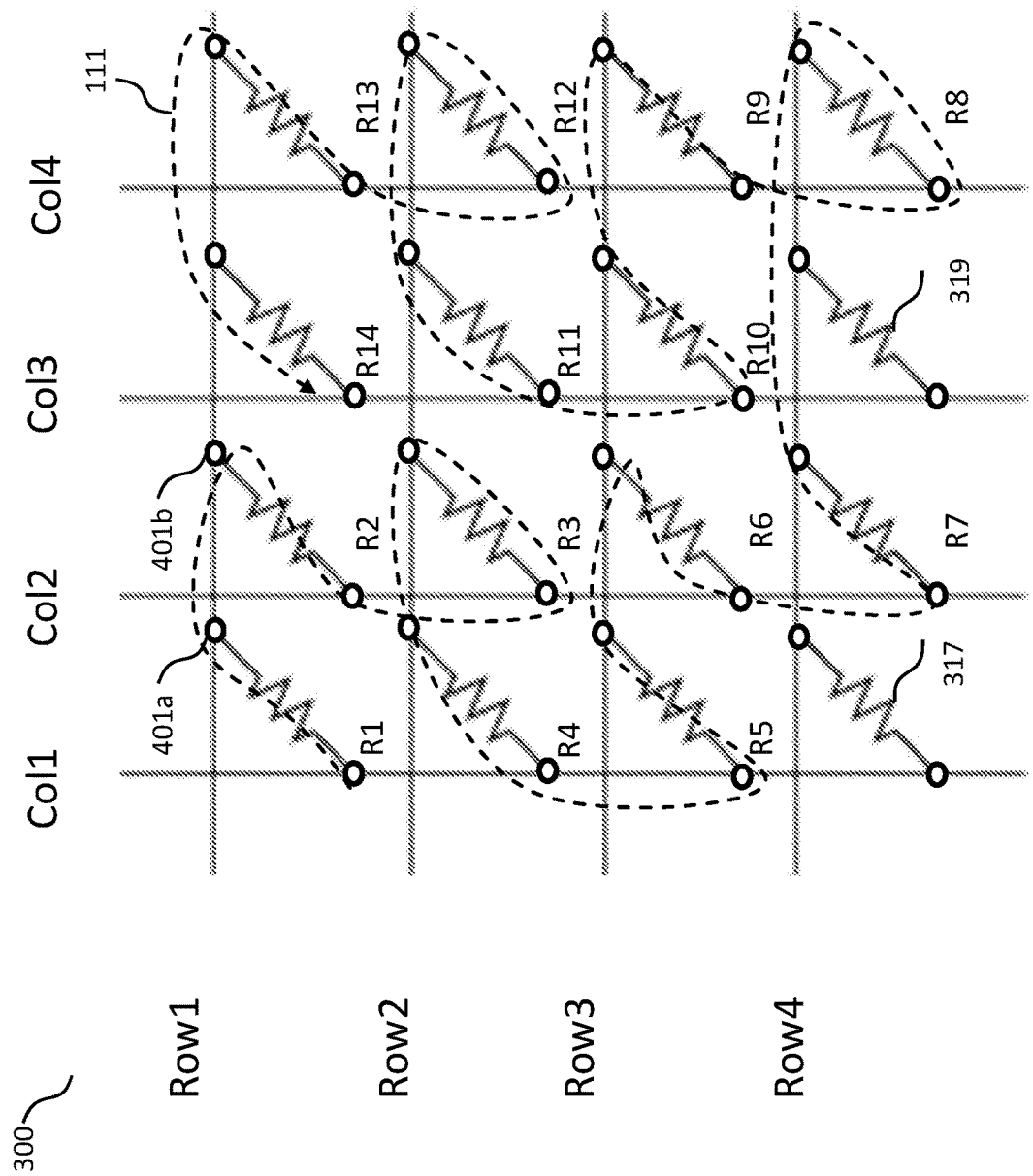
FIG. 3 shows an example schematic diagram of a multiturn counter with a matrix of interconnects to a series of magnetoresistive elements according to an embodiment.

FIG. 3 shows an example schematic diagram of a multiturn counter 300 with a matrix of interconnects to a series of magnetoresistive elements according to an embodiment. The illustrated multiturn counter 300 includes matrix interconnections to magnetoresistive elements R1-R14. The magnetoresistive elements R1-R14 correspond to the magnetic strip segments 103a-103n, respectively, of FIG. 1 in this example. Electrical connections are arranged in rows shown as Row1, Row2, Row3, and Row4. Electrical connections are arranged in columns shown as Col1, Col2, Col3, and Col4. The series connections of the magnetoresistive elements R1-R14 indicated by the dashed lines corresponds to the series connection of magnetoresistive elements R1-R14 in the schematic representation 150 of FIG. 1. FIG. 3 also shows unused magnetoresistive elements 317 and 319.

Together, the rows and columns form a matrix. The term "matrix" can refer to a logical or functional organization (not necessarily a geometrical assignment and not necessarily a physical layout) of electrical connections to magnetoresistive elements. The labels "row" and "column" can be independent from orientation and can be reversible. Each illustrated magnetoresistive element R1-R14 has a first end and a second end. In the embodiment shown in FIG. 3, rows of the matrix include electrical connections to first ends of magnetoresistive elements, and columns of the matrix include electrical connections to second ends of magnetoresistive elements. The rows and columns shown in matrix of FIG. 3 are not directly connected to each other. Instead, the rows and columns can be electrically coupled to each other through magnetoresistive elements.

Row1 is electrically connected to first ends of magnetoresistive elements R1, R2, R14, and R13. Row2 is electrically connected to first ends of magnetoresistive elements R4, R3, R11, and R12. Row3 is electrically connected to first ends of magnetoresistive elements R5, R6, R10, and R9. Row4 is electrically connected to first ends of magnetoresistive elements R7 and R8.

Col1 is electrically connected to second ends of magnetoresistive elements R1, R4, and R5. Col2 is electrically connected to second ends of magnetoresistive elements R2, R3, R6, and R7. Col3 is electrically connected to second ends of magnetoresistive elements R14, R11, and R10. Col4 is electrically connected to second ends of magnetoresistive elements R13, R12, R9, and R8.

The magnetoresistive elements R1-R14 can have a variety of arrangements in the matrix, and only one example embodiment is shown. In the example shown in FIG. 3, magnetoresistive elements 317 and 319 are unused and not included as part of the series connection of magnetoresistive elements. In some other embodiments, different magnetoresistive elements of the illustrated arrangement can be used or unused.

Figure 4:
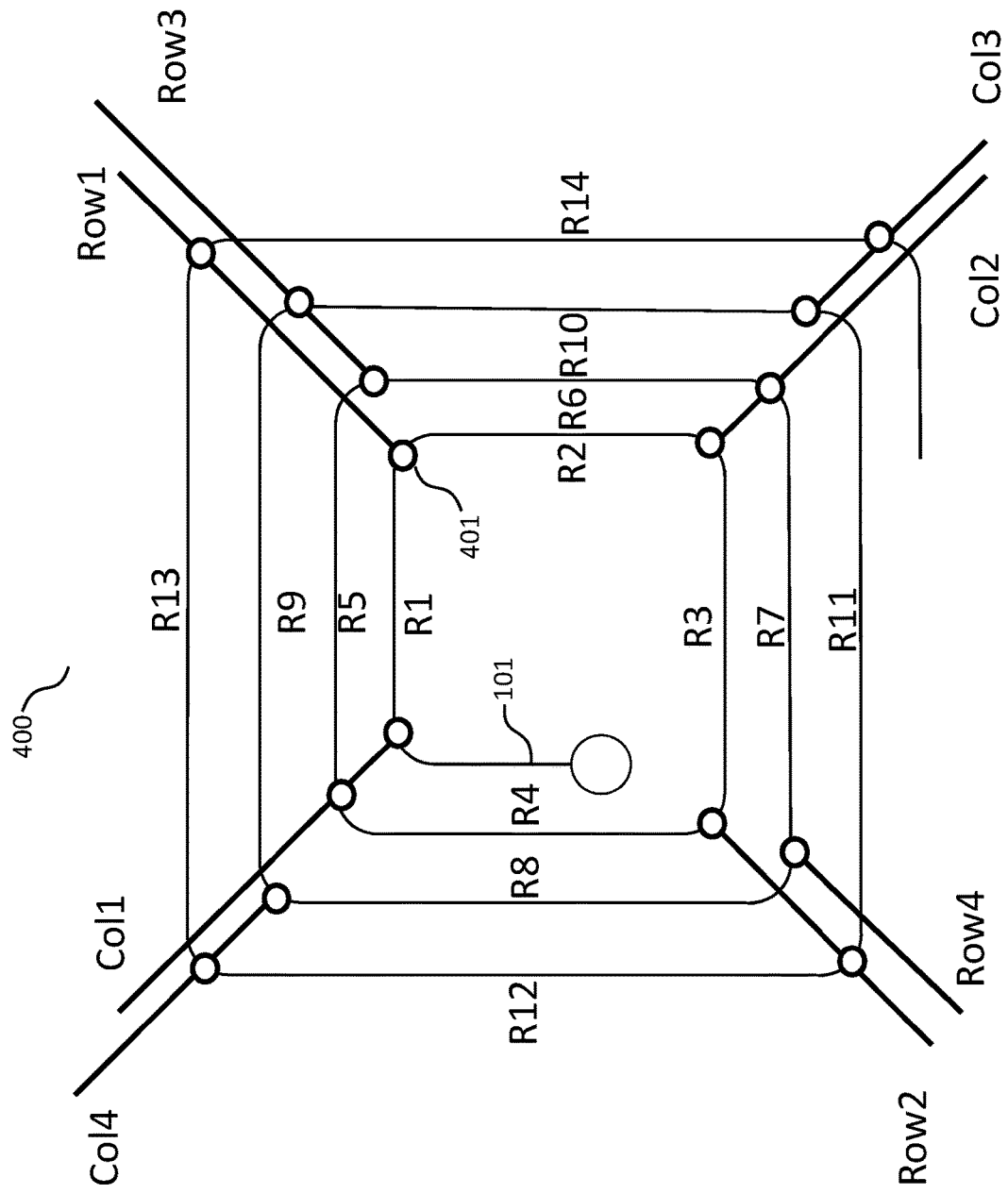
FIG. 4 shows an example layout view of the matrix from FIG. 3 electrically connected to the magnetoresistive elements of the magnetic strip from FIG. 1 according to an embodiment.

As shown in FIG. 3, four columns and four rows of electrical connections can connect the 14 magnetoresistive elements in series with each other. Although a total of 28 schematic connection nodes are shown as connecting the 14 magnetoresistive elements in FIG. 3, the schematic view shows the schematic connection nodes as duplicates of physical connection nodes for clarity. The connections can be implemented as 15 physical connection nodes as shown in FIG. 4. More generally, fewer physical connections than schematic connections can be implemented. This can reduce parasitic effects and/or physical area of the circuit layout.

For "N" usable magnetoresistive elements arranged in series with each other (i.e., 14 in FIG. 3), as few as "A" rows and "B" columns can be used where:

$N \leq A*B - A + 2$, where $B$ is a positive even number, and $N \leq A*(B-1) - A + 3$, where $B$ is a positive odd number.

Accordingly, a relatively small number electrical connections can be made between the magnetic strip and the matrix. This can simplify design and/or save on fabrication costs. In some embodiments, the number of physical connections between matrix and the magnetic strip is N+1 or N+2. In some embodiments, the number of physical connections between the matrix and the magnetic strip is less than 2N, or less than 2N+2, or less than 2N−2. As an approximation, the minimum number of rows and columns can increase with the square root of the number of magnetoresistive elements instead of increasing linearly with the number of magnetoresistive elements.

In some embodiments, "N," "A," and "B," can satisfy both of the equations, where K is a relatively small constant (e.g., ranging from 0 to 3, inclusive):

$N \leq (A+K)*(B+K)$, and $N \geq (A-K)*(B-K)$.

FIG. 4 shows an example layout 400 of the matrix from FIG. 3 electrically connected to the magnetoresistive elements of the magnetic strip 101 from FIG. 1 according to an embodiment. As illustrated, the magnetic strip 101 of magnetoresistive elements R1 to R14 is physically laid out in the shape of a spiral. In FIG. 4, the rows Row1, Row2, Row3, and Row4 and columns Col1, Col2, Col3, and Col4 connect the magnetoresistive element segments R1-R14 as schematically shown in the matrix of FIG. 3. In FIG. 4, a total of 15 physical connection nodes between the magnetic strip 101 and the matrix interconnections are shown. For example, physical connection node 401 in FIG. 4 is the equivalent of schematic connection nodes 401a, 401b in FIG. 3 because magnetoresistive elements R1 and R2 are connected in series as part of the magnetic strip 101 at physical connection node 401. Examples of physical connection nodes between the matrix of interconnects and the magnetic strip can include, for example, an electrically conductive connection between the magnetic strip and a metal layer, a solder connection to the magnetic strip, a via connection to the magnetic strip, a bump on the magnetic strip, a wire contact, etc.

In FIG. 4, the connections formed by the rows and columns can create short circuits between different parts of the spiral. For example, a physical connection node 401 between R1 and R2 is connected to a node between R13 and R14. Accordingly, this can complicate the series connection of magnetoresistive elements by creating a plurality of parallel connections that can make it more difficult to measure resistances and decode the magnetic state of the circuit. In fact, the complexity of parallel connections can cause some previous sensor designs can become inaccurate and/or inoperable to measure resistances.

Figure 6:
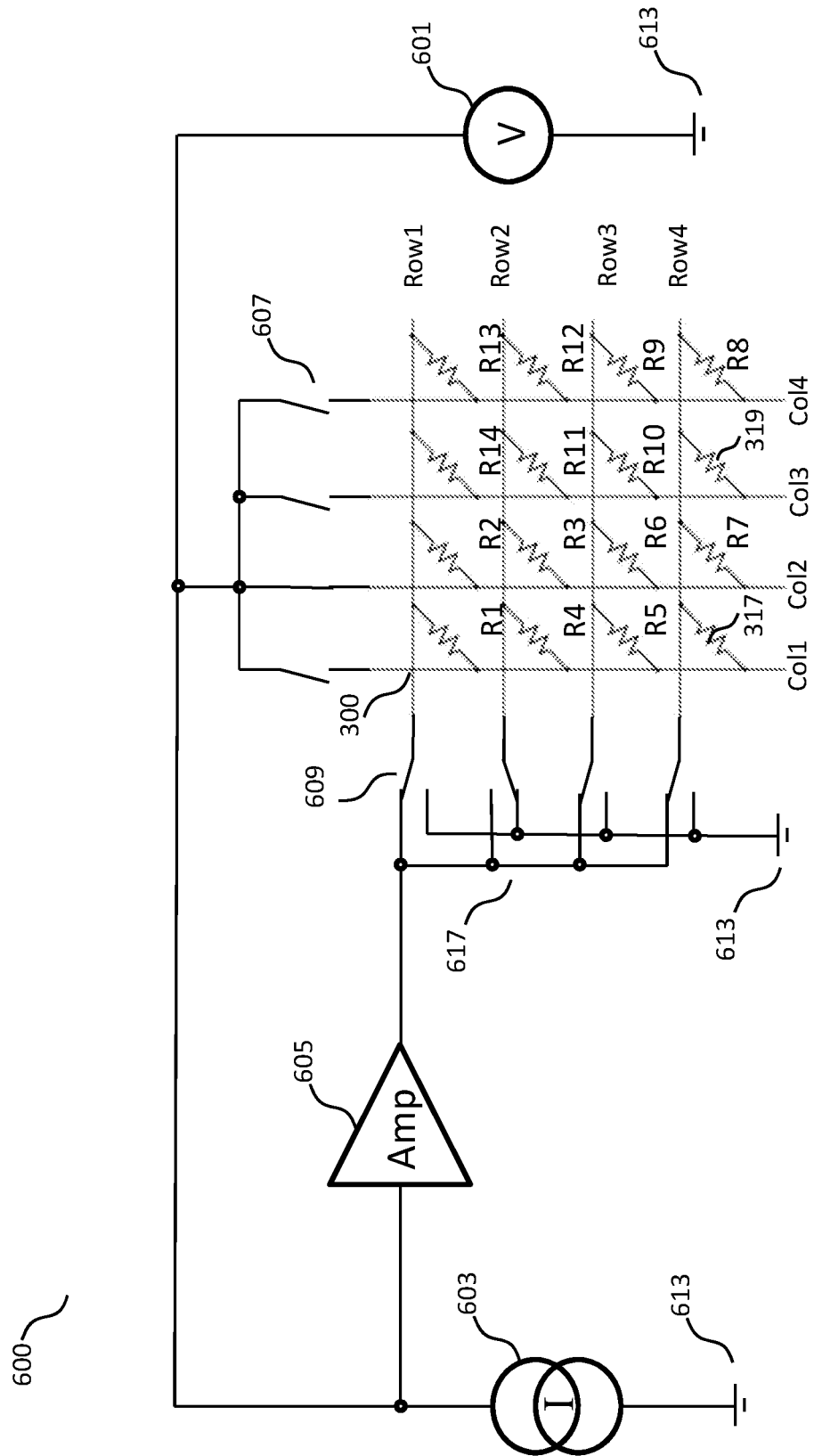
FIG. 6 shows an example schematic of an electronic system that includes a driving and sensing circuit electrically connected through a matrix of interconnects to a series of magnetoresistive elements according to an embodiment.
Figure 8:
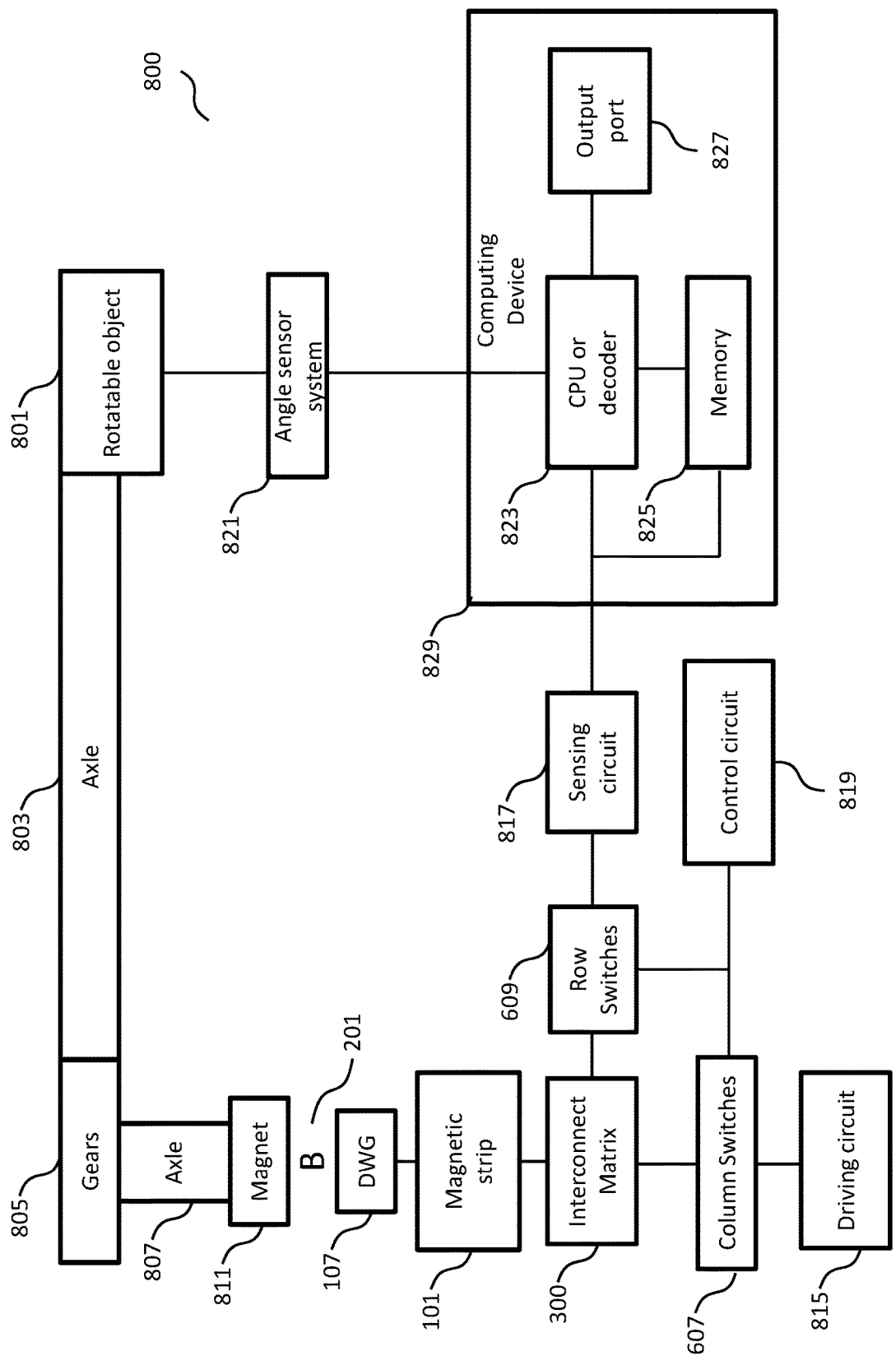
FIG. 8 shows an example multiturn counter system according to an embodiment.

A driving and sensing circuit (such as shown in FIG. 6, FIG. 7, and FIG. 8) enables resistances to be determined despite the complexity of additional parallel connections. Such a driving and sensing circuit can be used to read out the magnetic state stored by the magnetic strip 101 and to provide an indication of a number of turns of a rotatable element in located in proximity to the magnetic strip 101.

Figure 5:
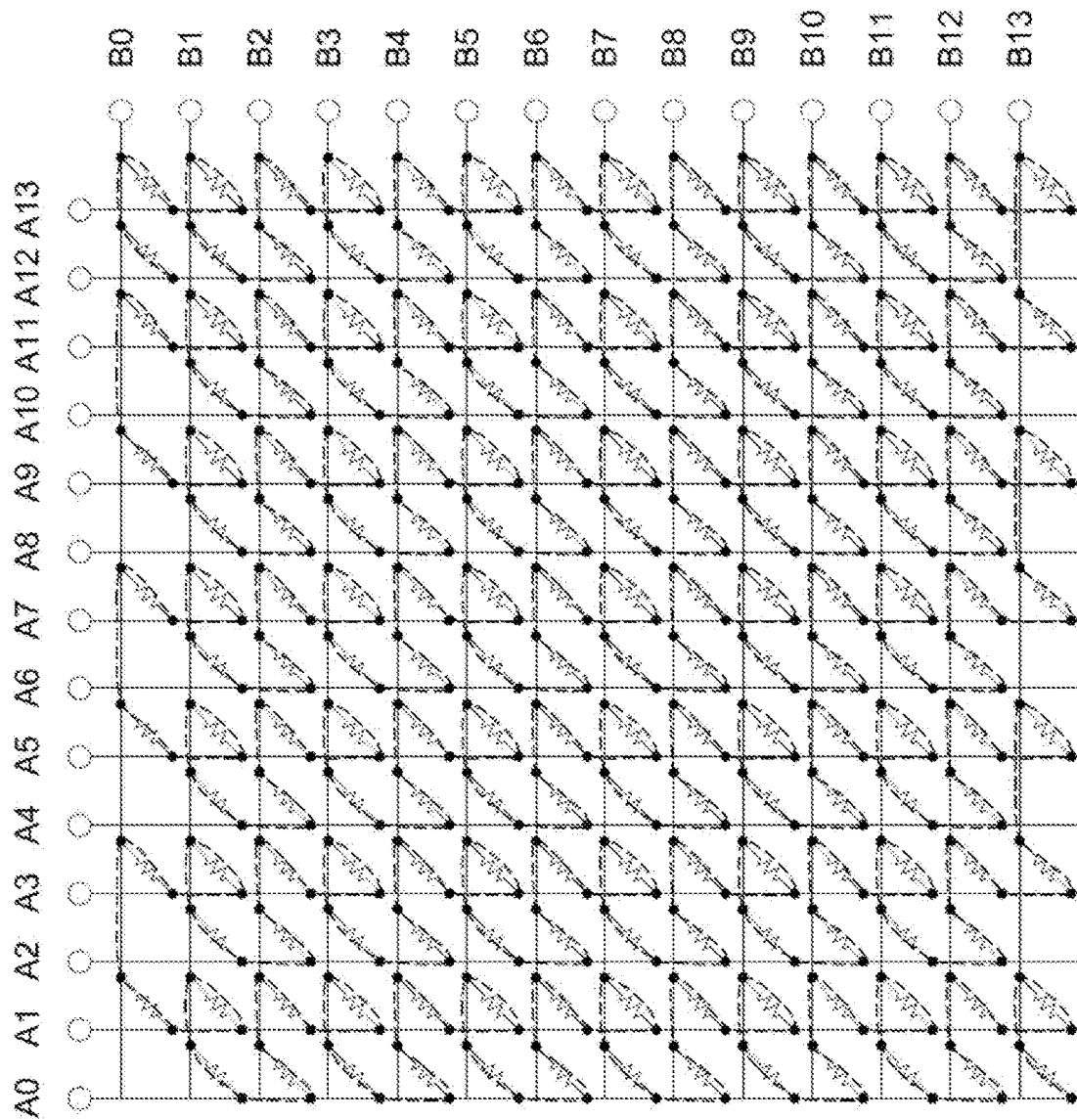
FIG. 5 shows a schematic diagram of a matrix electrically connected to a series of magnetoresistive elements for a 46 turn counter according to an embodiment.

FIG. 5 shows a schematic diagram 500 of a matrix electrically connected to a series of magnetoresistive elements for a 46 turn counter according to an embodiment. Columns A0-A13 and rows B0-B13 logically connect with a series of 184 magnetoresistive elements. The rows B0-B13 couple to first ends of magnetoresistive elements. The columns A0-A13 couple to second ends of magnetoresistive elements. The matrix has several unused positions. Various embodiments can have different matrix sizes, a different arrangement of the series of magnetoresistive elements, different locations for unused positions, etc. Accordingly, the principles and advantages discussed herein can be applied to matrices of varying sizes, varying numbers of magnetoresistive elements, and varying arrangements of the series of magnetoresistive elements.

FIG. 6 shows an example schematic 600 of an electronic system that includes a driving and sensing circuit electrically connected through a matrix of interconnects to a series of magnetoresistive elements R1-R14 according to an embodiment. The driving and sensing circuit comprises a voltage meter 601, current source 603, amplifier 605, column switches 607, row switches 609, the matrix 300 electrically connected to the series of magnetoresistive elements R1-R14 (e.g., as described in connection with FIG. 3), and a reference node 613. The driving and sensing circuit can select a row and a column of the matrix 300 by controlling the column switches 607 and the row switches 609 to detect a resistance of a selected magnetoresistive element of the magnetoresistive elements R1-R14. Accordingly, the driving and sensing circuit can read out an indication of the magnetic state stored by the selected magnetoresistive element. By taking at least twice as many readouts as the number of turns that can be counted by the magnetoresistive elements R1-R14, the number of turns (or a ratio thereof) of a rotatable element in located in proximity to the magnetoresistive elements R1-R14 can be determined. In some embodiments, the number of sensors can be relatively low (e.g., 1 or 2), even when counting relatively high numbers of turns. Although more parallel sensors can be added for speed, using a relatively low number of sensors typically reduces circuit complexity and production costs. A smaller number of sensors can be used compared to other designs that involve an increased number of sensors when the number of countable turns increases. The sensor can have outputs that are not tied together with reduced signal quality.

The driving circuit is configured to apply a current across the selected magnetoresistive element (e.g., magnetoresistive element R3 as illustrated in FIG. 6), thereby causing a voltage drop across the selected magnetoresistive element. The voltmeter 601 can detect and/or measure the voltage across the selected magnetoresistive element, thereby allowing a determination of the magnetic state (HR or LR) of a segment of the magnetic strip 101 (e.g., as explained in the discussion of FIG. 2). Any other suitable resistive sensing circuit arranged to determine the resistive of the selected magnetoresistive element can be implemented in place of or in addition to the voltmeter 601. For example, a comparator circuit can detect whether the magnetic state HR or LR is greater than or less than a medium resistance. Each magnetoresistive element can be individually selected and measured so that the magnetic state of the multiturn sensor can be decoded to determine how many times a magnetic field 201 has been fully rotated around the magnetoresistive elements R1-R14. In some embodiments, the guarding principle can be applied to enable sensing.

A magnetoresistive element of the magnetoresistive elements R1-R14 can be selected by toggling a switch of the column switches 607 so that the current source 603 is coupled to a single selected column (e.g., Col 2 as illustrated in FIG. 6) in the matrix 300, the selected column having an electrical connection to the selected magnetoresistive element (e.g., R3 as illustrated in FIG. 6). The column switches 607 are configured to open connections to unselected columns so that magnetoresistive elements electrically coupled the unselected columns are electrically disconnected from the voltmeter 601 and should not affect a voltage reading.

The current source 603 is input to an amplifier 605, such as a unity gain or an 1× amplifier, to cause the output of the amplifier 605 to have approximately the same voltage as the voltage across the selected magnetoresistive element. Row switches 609 toggles to connect rows of the matrix to either the output of the amplifier 605 or the reference node 613. The row switches 609 can be toggled such that a selected row (e.g., Row 2 as illustrated in FIG. 6), which is electrically connected to the selected magnetoresistive element (e.g., R3 as illustrated in FIG. 6), is electrically connected to the reference node 613. As a result, current provided through the selected column (e.g., Column 3 as illustrated in FIG. 6) can flow through the selected magnetoresistive element (e.g., R3) and flow through the selected matrix row (e.g., Row 2) to the reference node 613. Rows not electrically connected to the selected magnetoresistive element can be electrically connected to the output of the amplifier 605 by way of the row switches 609. Accordingly, current (if any) provided through non-selected magnetoresistive elements should not cause a voltage drop across the non-selected magnetoresistive elements.

Combinations of switches in the column switches 607 and combinations of switches in the row switches 609 can be toggled in a sequence such that the resistances of the different, individual segments of the magnetic strip 101 can be determined. Accordingly, the matrix can avoid tying multiple signals together and can avoid a reduced signal quality. The column switches 607 and the row switches 609 can be toggled by any suitable control circuit (not illustrated in FIG. 6). The measured voltages can be sampled, held, stored, decoded, or any combination thereof. Measured voltages can be converted to determine a resistance in accordance with the equation V=I*R, and the resistances can be used to determine the magnetic orientation the different segments of the magnetic strip 101 based on whether the resistance is high or low (e.g., as described with reference to FIG. 2), and then a turn state can be decoded. In some embodiments, additional circuitry, such as decoder logic, a temperature varying reference component, or the like, can account for different segment lengths and/or temperature variations.

In some embodiments, the driving and sensing circuit can be suitably adjusted to replace voltmeter 601 with an ohmmeter, ammeter, or other measurement circuit. In some embodiments, the current source 603 can be replaced with a voltage source and the voltmeter 601 can be replaced with an ammeter or other measurement device with minor adjustments to the driving and sensing circuit of FIG. 6. In some embodiments, the row switches 609, column switches 607, and amplifier 605 can be duplicated and/or coupled between the magnetoresistive elements and the matrix, thereby allowing another way to control connections between individual magnetoresistive elements and the matrix. In some embodiments, the voltmeter can be based on a Wheatstone bridge circuit, however, even in such cases, the number of Wheatstone bridge circuits can reduced without tying output signals together. In some embodiments, more than one matrix, one driving circuit, and one sensing circuit can be used. For example, two 2×4 matrixes, each with a driving and sensing circuit, can be used where each matrix covers half of the 4×4 grid. This can allow parallel processing and faster speeds. In some embodiments, the row switches 609 and/or column switches 607 can be implemented as transistors, as mechanical switches, as microelectromechanical system (MEMS) switches, as a plurality of single switches, as single or multi throw switches, as single or multi pole switches, as changeover switches, various other switching technologies, or any combination thereof.

A single sensing circuit (e.g., voltmeter 601) can be used regardless of the number of magnetoresistive elements in the matrix or the size of the matrix. Furthermore, the magnetoresistive elements electrically connected to the matrix are not wired as part of a Wheatstone bridge configuration in the embodiment of FIG. 6. There are fewer outputs and less sensing circuitry in the embodiment of FIG. 6 compared to if Wheatstone bridge circuits were implemented.

FIG. 7 shows an example schematic 700 of a driving and sensing circuit electrically connected through a matrix of interconnects to a series of magnetoresistive elements. Like in FIG. 6, the driving and sensing circuit in FIG. 7 comprises a current source 603, amplifier 605, column switches 607, row switches 609, the matrix 300 electrically connected to the series of magnetoresistive elements R1-R14 (as detailed in FIG. 3), a selected magnetoresistive element (e.g., R4 as illustrated in FIG. 7) at a selected column (e.g., Col1 as illustrated in FIG. 7) and a selected row (e.g., Row2 as illustrated in FIG. 7), and a reference node 613. As shown in FIG. 7, the voltmeter 601 of FIG. 6 is replaced in FIG. 7 with sample and hold (S&H) circuits 701, 703, a comparator 705, and a digitizer 707 such as an analog to digital converter or window comparator. The driving and sensing circuit can also include a node 709 that, in some embodiments, can be an S&H selector such as a switch.

FIG. 7 shows a state where the column switches 607 and row switches 609 are such that the driving and sensing circuit is configured to measure a resistance of the magnetoresistive element R4. The column switches 607 in FIG. 7 has a different combination of opened and closed switches compared to the column switches 607 in FIG. 6. This allows the measurement to be made in connection with a different magnetoresistive element than in FIG. 6. The row switches 609 in FIG. 7 has the same combination of opened and closed switches compared to the column switches 609 in FIG. 6, but it will be understood that the row switches 609 in FIG. 7 can have a different combination of opened and closed switches compared to the row switches 609 in FIG. 6 when selecting some other magnetoresistive elements. It will be further understood that the column switches 607 and row switches 609 can select any one of magnetoresistive elements R1-R14 for measurement in either FIG. 6 or FIG. 7.

Selected magnetoresistive elements (e.g., R3 in FIG. 6 and R4 in FIG. 7) can be selected according to the principles explained above with respect to FIG. 6. Instead of measuring a voltage across the selected magnetoresistive elements and decoding the voltages, the voltages of different selected magnetoresistive elements are compared to each other before decoding in the embodiment of FIG. 7.

The column switches 607 and row switches 609 can select a magnetoresistive element, the voltage across selected magnetoresistive element (e.g., R3) can be sampled and held by a first sample and hold circuit 701. The column switches 607 and row switches 609 can select another magnetoresistive element, the voltage across other magnetoresistive element (e.g., R4) can be sampled and held by a second sample and hold circuit 703. An S&H selector can be used to toggle between S&H circuit 701 and S&H circuit 703. The S&H selector can be, for example, a switch implemented at node 709 (not illustrated) to alternate between electrically coupling to S&H circuits 701, 703. In some embodiments, both S&H circuits 701, 703 can be electrically connected at node 709, but a clock signal can be supplied to S&H circuit 701 and an inverse clock signal can be supplied to S&H circuit 703.

In some embodiments, an analog comparison can be performed. A comparator 705 can compare the outputs of S&H circuits 701 and 703. In some embodiments, digital components can be included with the analog components. The output of the comparator 705 can be provided to the digitizer 707 such as an analog to digital converter or window comparator. In some embodiments, the digitizer 707 includes a window comparator that has three outputs of high, zero, and low based on whether a first input value is greater than, equal to, or less than a second input value. The output of the digitizer can be stored, processed, or decoded.

In some embodiments, a digital comparison can be performed. An amplifier can amplify a signal, such as a voltage, from row switches 607. The amplifier can output an amplified analog signal to a digitizer. The digitizer can comprise an analog to digital converter or window comparator that converts the analog signal into a digital signal having a digital value. The digital value can be stored into a memory and a digital processor such as a computer or decoder (for example, as shown in FIG. 8) configured as a comparator to compare the digital value to one or more other digital values. The output of the digitizer 707 can be stored, processed, or decoded. In some embodiments, a signal's value can be stored in analog circuitry such as sample and hold circuits 701 and 703, in a digital memory, or both.

The comparison process can be iterated to perform comparisons for different combinations of magnetoresistive elements in a magnetic strip 101. For instance, a comparison can be performed in connection with each magnetoresistive element of the magnetic strip 101. In some embodiments, each magnetoresistive element is compared to a neighboring magnetoresistive element (e.g., R1 is compared to R2, R2 is compared to R3, R3 is compared to R4, etc.). In some embodiments, each magnetoresistive element in the magnetic strip 101 can be compared at least once. In some embodiments, the magnetoresistive elements are not compared to neighboring magnetoresistive elements. In some embodiments, the comparisons can be performed in a different order. In some embodiments, only a sufficient comparison of magnetoresistive elements to generate unique comparisons of outputs performed. The comparison outputs can be decoded to determine the state of the multiturn counter. The comparison sensors system can be used where relatively large temperature variations might occur (e.g., in a vehicle, outdoors) because temperature changes may affect all magnetoresistive elements substantially equally or proportionally. Accordingly, by comparing magnetoresistive elements, temperature variations can be canceled out, at least in part, to have reduced, minimal or even no impact on accuracy.

FIG. 8 shows an example multiturn counter system 800 according to an embodiment. The system includes a rotatable object 801, axles 803 and 807, gears 805, one or more magnets 811, a magnetic field 201, a domain wall generator 107, a magnetic strip 101, an interconnect matrix 300, column switches 607, row switches 609, a driving circuit 815, a sensing circuit 817, a control circuit 819, an angle sensor system 821, a computing device 829, a CPU or decoder 823, memory 825, and an output port 827. The driving circuit 815 and sensing circuit 817 can implement any of the principles and advantages described in connection with the driving and sensing circuits discussed herein, for example, with reference to FIG. 6 and/or FIG. 7.

A rotatable object, such as a knob, a steering wheel, a lever, a handle, a propeller, a wheel, a ball, etc. can be coupled to the magnet 811. One or more axels 803, 807 and gears 805 can be used to multiply the number of times that the magnet 811 rotates per turn of the object 801. While axels and gears are illustrated in FIG. 8, it will be understood that neither axels nor gears are included in certain embodiments. The magnet 811 generates a magnetic field 201 and causes the magnetic field 201 to orient in different directions based on the orientation of the magnet. Changing the magnetic field 201 can cause a domain wall generator 107 to propagate domain walls through a magnetic strip 101, which can be physically laid out in the shape of a spiral. Switches 607 and 609, which can be toggled in particular sequences by a control circuit 819, can couple a driving circuit 815 and sensing circuit 817 through an interconnect matrix 300 to the magnetic strip 101. Measurements of the sensing circuit can be provided (e.g., transmitted) to a computer 829. The measurements can be stored in a memory 825, and a CPU or decoder 823 can convert the measurements into a decoded output, which can be a digital output, to be output through output port 827 or to be used internally within the computing device (e.g., within CPU 823). The system 800 can include an angle sensor system 821. An angle sensor system can detect an angular position of the turning object 801, but may lack the ability to count turns (e.g., be unable to differentiate between zero degrees and 360 degrees). The angle sensor can be, for example, a single or half turn angle sensor. The angle sensor can be based on anisotropic magnetoresistive, tunnel magnetoresistance, GMR, Hall effect, or other technology. The decoded output 827 can be used in conjunction with the angle sensor system 821 to precisely determine accumulated turned angle of the object 801.

FIGS. 9-18 show an example of progressive turn states of an example 2 turn counter. Although a 2 turn sensor is shown for illustrative purposes, the principles and advantages discussed with reference to these figures can be applied to other multiturn sensors. Additionally, these features discussed with respect to FIG. 9-18 can be implemented with any of the other principles and advantages discussed herein.

Figure 9:
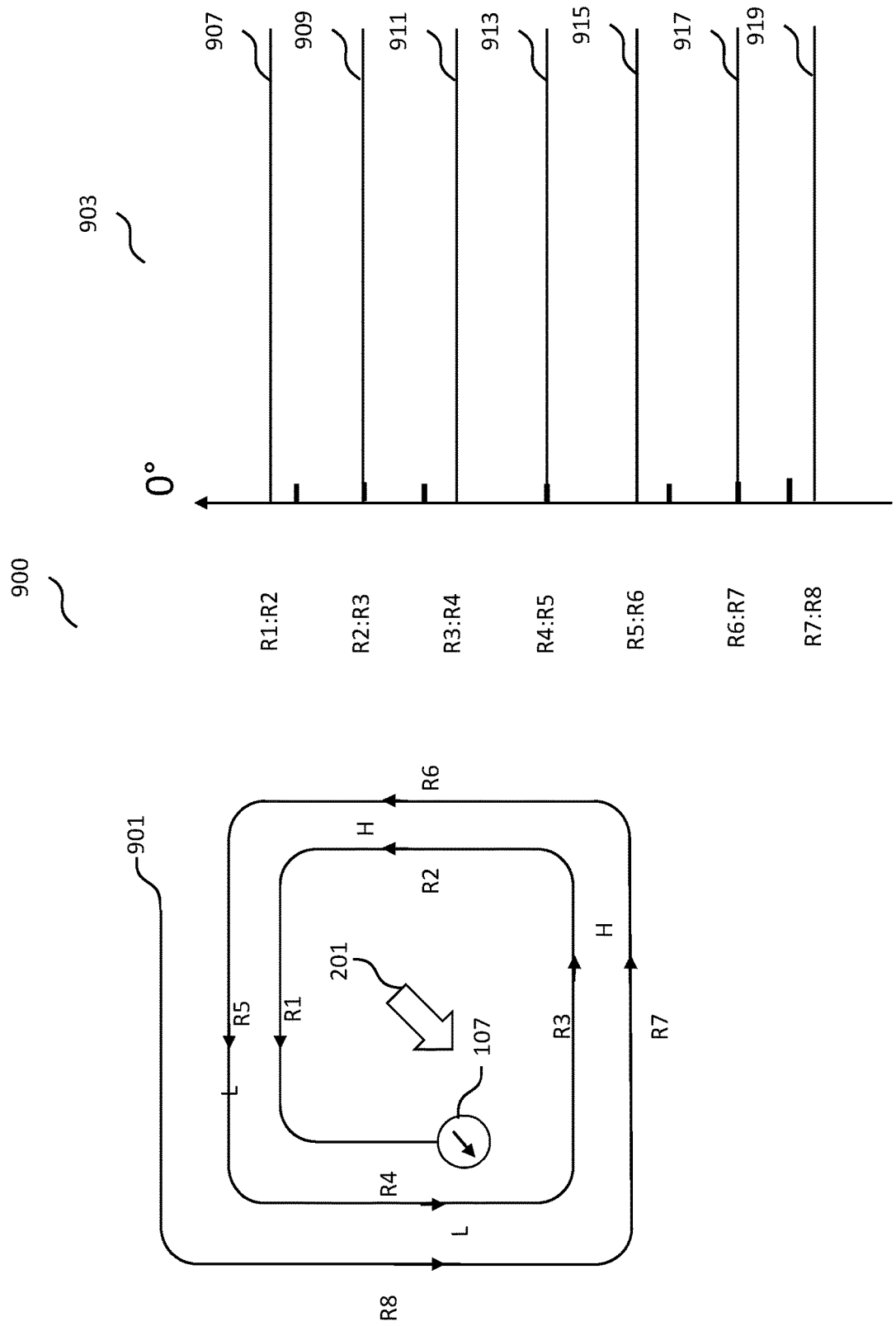
FIGS. 9-18 show an example of progressive turn states of an example 2 turn counter as a magnetic field rotates in accordance with an embodiment.

FIG. 9 shows a multiturn sensing system 900, magnetic strip 901, domain wall generator 107, magnetic field 201, output graph 903 corresponding to a turn angle of zero degrees, and comparison outputs 907, 909, 911, 913, 915, 917, and 919. FIGS. 10-18 also show domain walls 921, 923, 925, 927, 929.

The magnetic strip 901 is laid out in the physical shape of a spiral, having rounded corners and straight segments. The magnetic strip 901 is coupled to a DWG 107 configured to propagate domain walls through the magnetic strip 901, thereby changing magnetic orientations of parts of the magnetic strip.

The straight segments function as variable magnetoresistive elements R1 to R8 that can have a high resistance value "H" or low resistance value "L" depending on the magnetic domain within the segment. The magnetoresistive element states shown for the spiral 901 can be used to decode a sequence of measured resistances (e.g., the outputs of circuit 600 in FIG. 6) into a turn state. End magnetoresistive elements R0 and R9 are unused, although in other embodiments, R0 and R9 can be used.

Signals corresponding to the output graph 903 can be used to decode the compared outputs of magnetoresistive elements, for example, the outputs from the circuit 700 in FIG. 7. Depending on the specific implementations details of FIG. 7, graph 903 can correspond to an inverted output. Output graph 903 shows output 907 of the resistance of R1 compared to the resistance of R2, output 909 of the resistance of R2 compared to the resistance of R3, output 911 of the resistance of R3 compared to the resistance of R4, output 913 of the resistance of R4 compared to the resistance of R5, output 915 of the resistance of R5 compared to R6, output 917 of the resistance of R6 compared to R7, and output 919 of the resistance of R7 compared to R8. The comparison outputs can be low (first magnetoresistive element has a lower resistance than the second magnetoresistive element), zero (magnetoresistive elements have equal resistances), or high (first magnetoresistive element has a higher resistance than the second magnetoresistive element).

Figure 10:
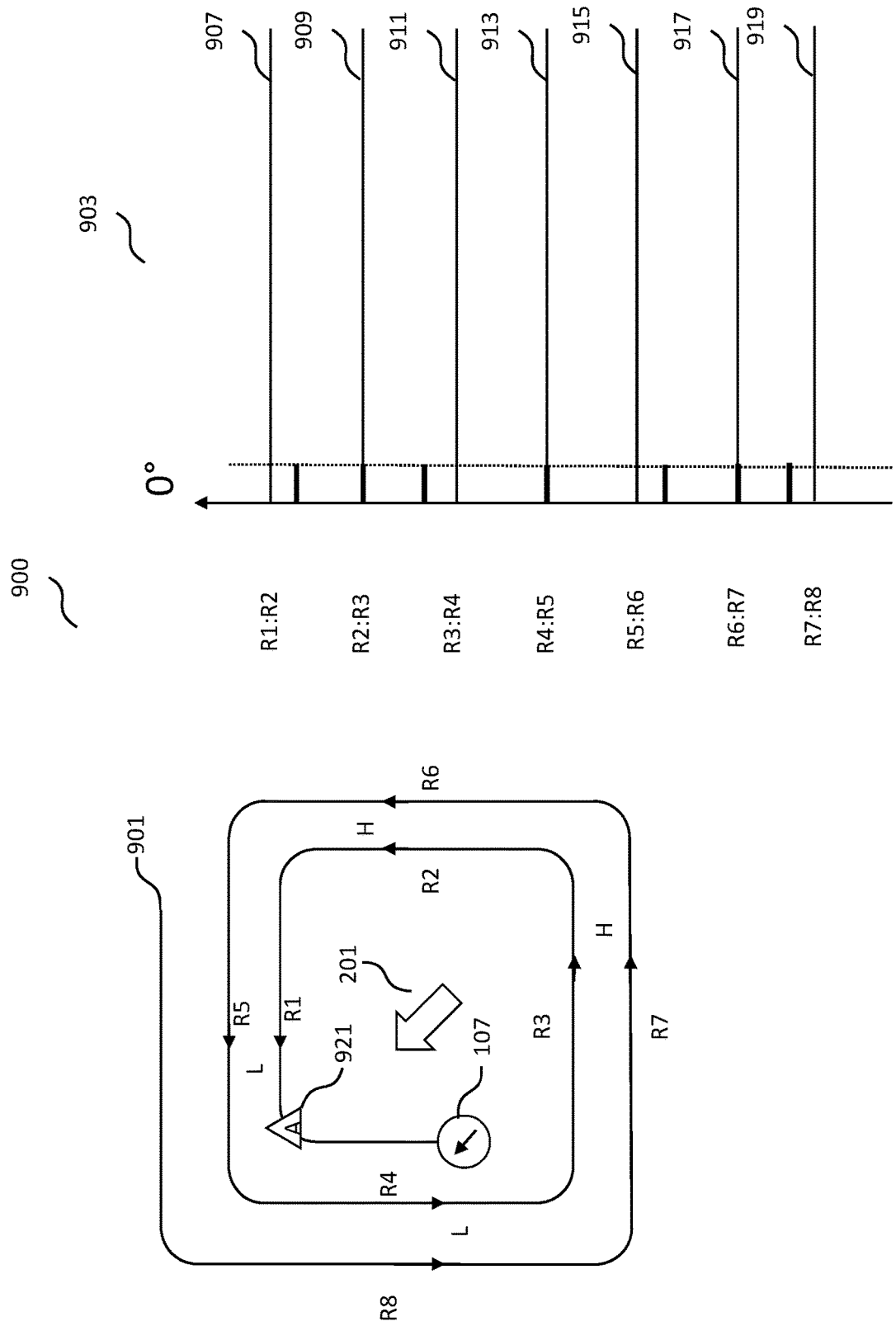

FIG. 10 shows the example 2 turn counter of FIG. 9 in a starting state at 0 degrees. A first domain wall 921 is generated by the domain wall generator in response to a rotation in the magnetic field 201. In FIG. 10, magnetoresistive elements R1, R5, R9, R4, and R8 have low resistances and magnetoresistive elements R2, R6, R3, and R7 have high resistances. As shown by the output graph 903, output 907 of R1:R2 is low, output 909 of R2:R3 is zero, output 911 of R3:R4 is high, output 913 of R4:R5 is zero, output 915 of R5:R6 is low, output 917 of R6:R7 is zero, and output 919 of R7:R8 is high.

Figure 11:
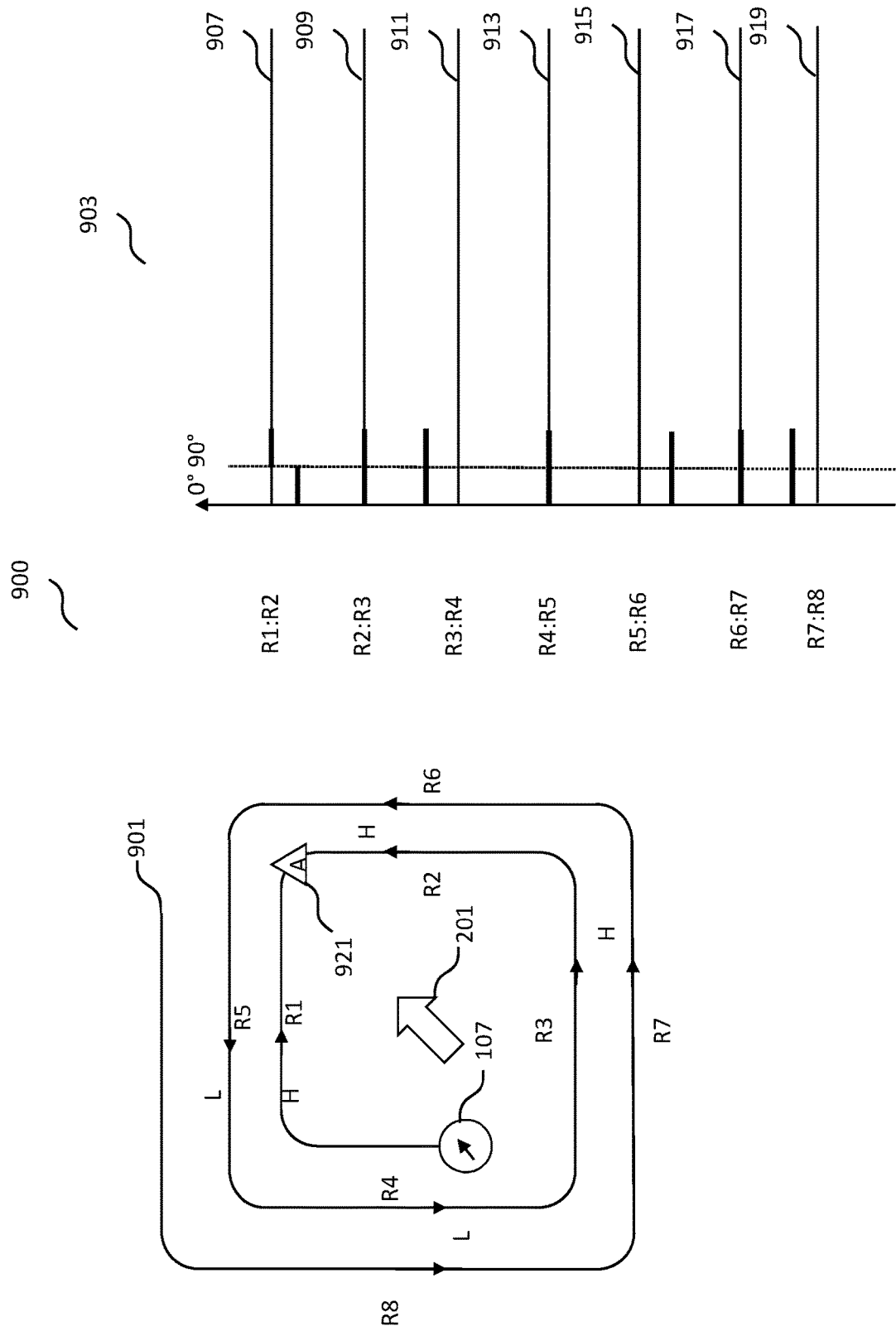

FIG. 11 shows the example 2 turn counter of FIG. 9 in a state where the magnetic field has rotated clockwise 90 degrees relative to the state corresponding to FIG. 10. In FIG. 11, the first domain wall 921 is shifted past R1. In FIG. 11, magnetoresistive elements R5, R9, R4, and R8 have low resistances and magnetoresistive elements R1, R2, R6, R3, and R7 have high resistances. As shown by output graph 903, output 907 of R1:R2 is zero, output 909 of R2:R3 is zero, output 911 of R3:R4 is high, output 913 of R4:R5 is zero, output 915 of R5:R6 is low, output 917 of R6:R7 is zero, and output 919 of R7:R8 is high.

Figure 12:
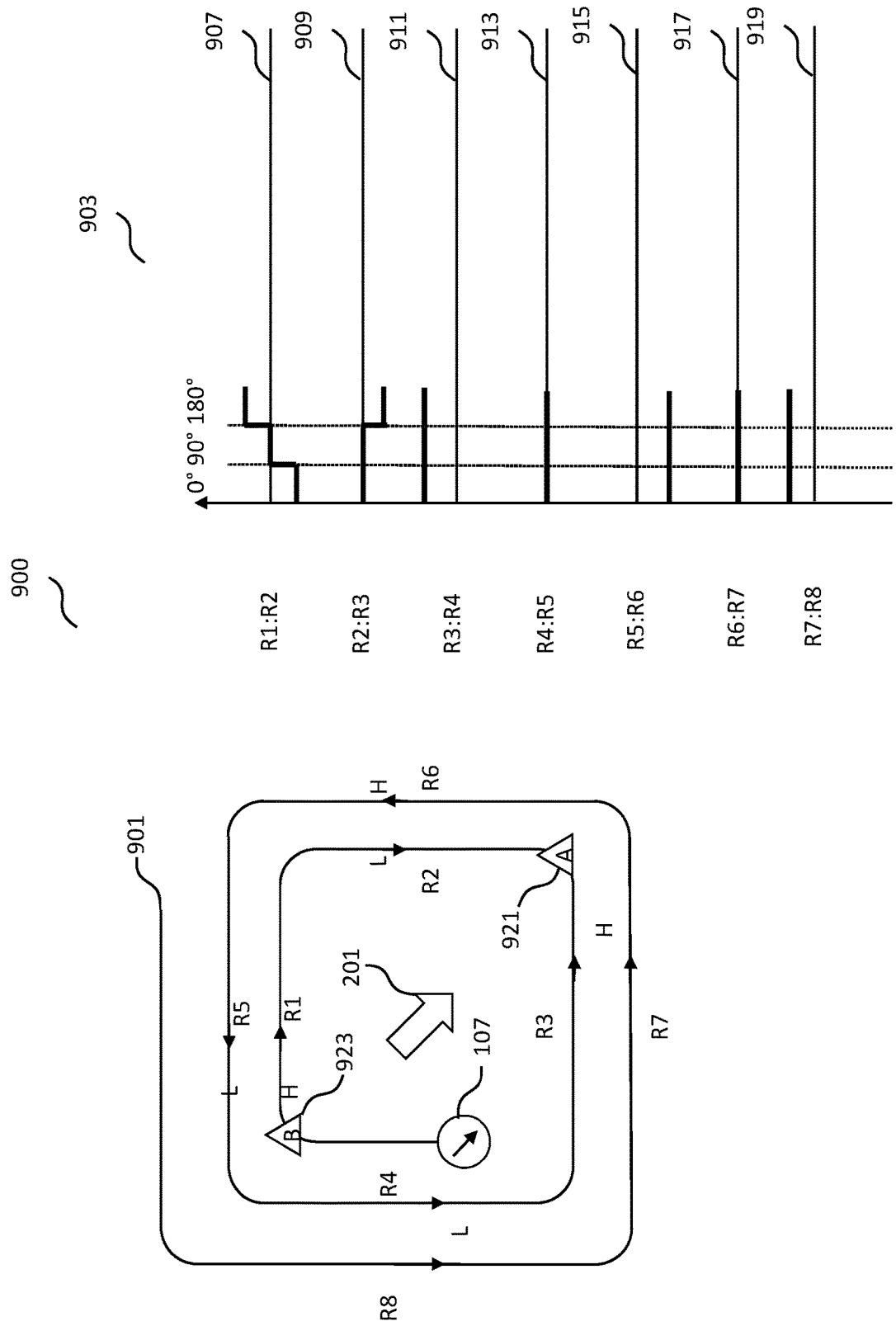

FIG. 12 shows the example 2 turn counter of FIG. 9 in a state where the magnetic field has rotated clockwise 180 degrees relative to the state corresponding to FIG. 10. In FIG. 12, the first domain wall 921 is shifted past R2, and a second domain wall 923 is generated. In FIG. 12, magnetoresistive elements R2, R5, R9, R4, and R8 have low resistances, and magnetoresistive elements R1, R6, R3, and R7 have high resistances. As shown by output graph 903, output 907 of R1:R2 is high, output 909 of R2:R3 is low, output 911 of R3:R4 is high, output 913 of R4:R5 is zero, output 915 of R5:R6 is low, output 917 of R6:R7 is zero, and output 919 of R7:R8 is high.

Figure 13:
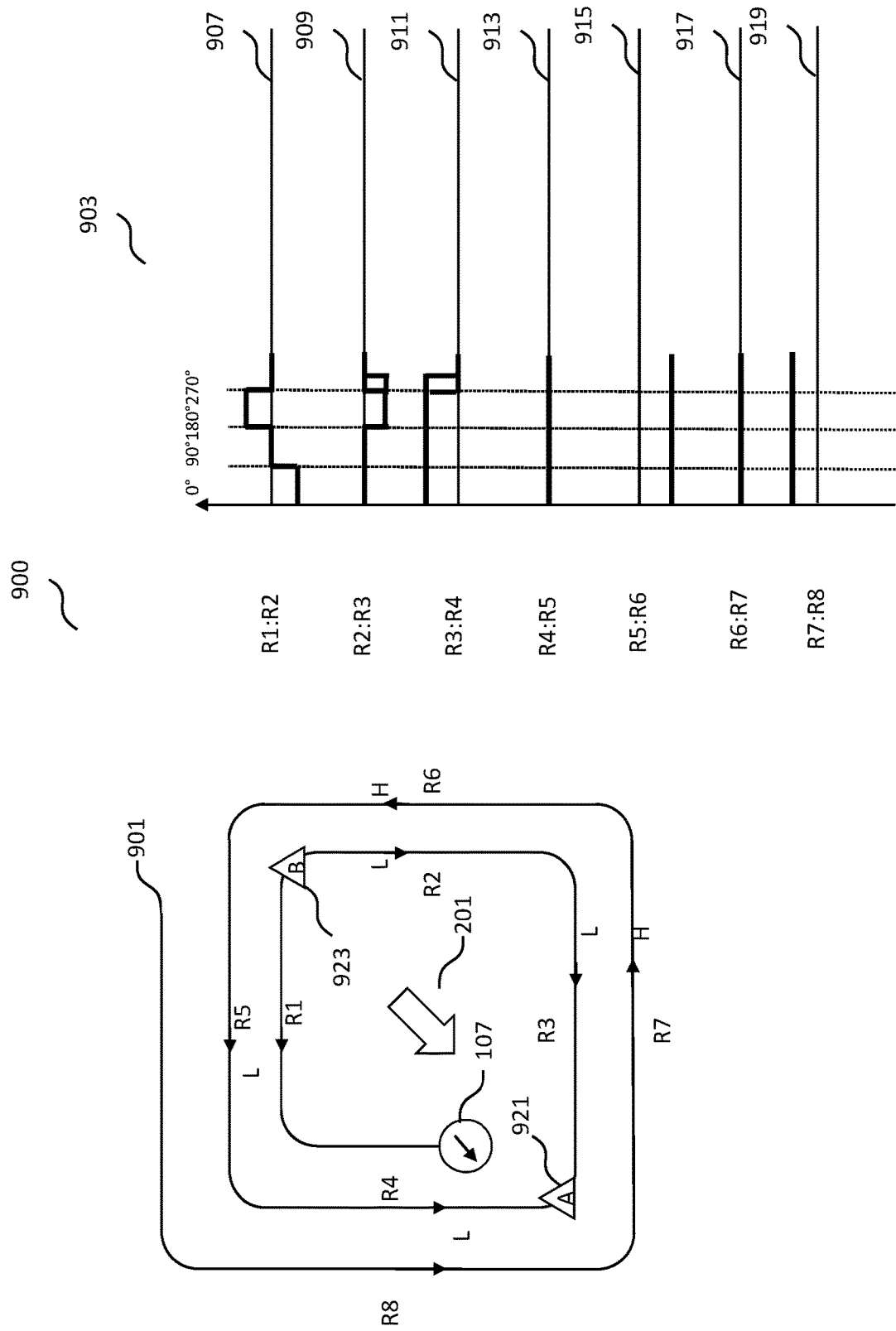

FIG. 13 shows the example 2 turn counter of FIG. 9 in a state where the magnetic field has rotated clockwise 270 degrees relative to the state corresponding to FIG. 10. In FIG. 13, the first domain wall 921 is shifted past R3 in FIG. 13, and a second domain wall 923 is shifted past R1. In FIG. 13, magnetoresistive elements R1, R2, R3, R5, R4, and R8 have low resistances, and magnetoresistive elements R6 and R7 have high resistances. As shown by output graph 903, output 907 of R1:R2 is zero, output 909 of R2:R3 is zero, output 911 of R3:R4 is zero, output 913 of R4:R5 is zero, output 915 of R5:R6 is low, output 917 of R6:R7 is zero, and output 919 of R7:R8 is high.

In some embodiments, due to the longer length of R3 compared to R1, the domain wall 921 may take longer to shift past R3 than the time it takes for domain wall 923 to shift past R1. This can be accounted for by increasing a clock duty cycle to have a period long enough for a domain wall to pass the longest segment of the magnetic strip 901 before sensing a measurement. Alternatively, a decoder can be implemented to account for the timing glitches because the outputs nonetheless can produce unique, decodable combinations despite the different timings.

Figure 14:
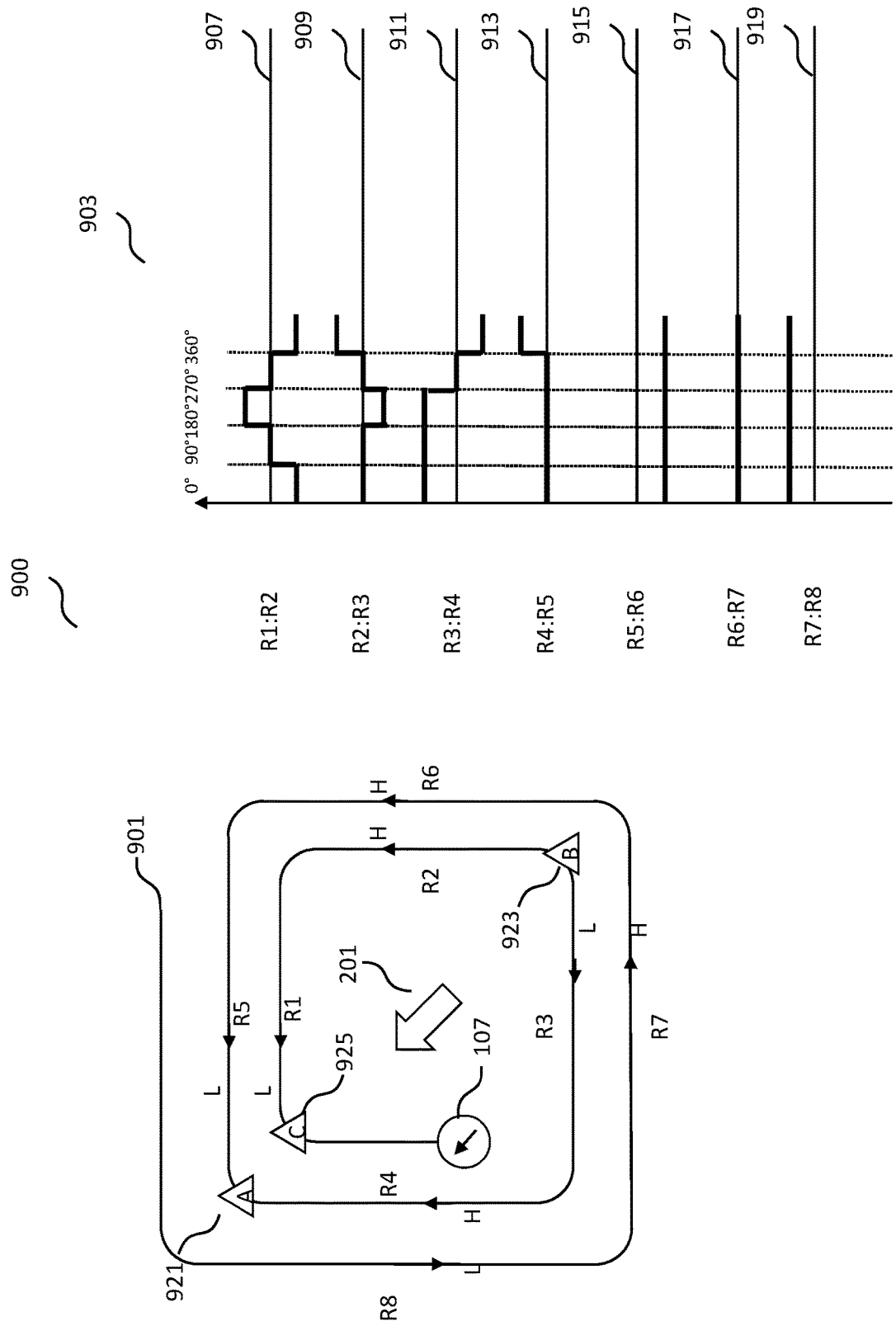

FIG. 14 shows the example 2 turn counter of FIG. 9 in a state where the magnetic field has rotated clockwise 360 degrees relative to the state corresponding to FIG. 10. In FIG. 14, the first domain wall 921 is shifted past R4, the second domain wall 923 is shifted past R2, and a third domain wall 925 is generated. In FIG. 14, magnetoresistive elements R1, R3, R5, and R8 have low resistances, and magnetoresistive elements R2, R4, R6, and R7 have high resistances. As shown by output graph 903, output 907 of R1:R2 is low, output 909 of R2:R3 is high, output 911 of R3:R4 is low, output 913 of R4:R5 is high, output 915 of R5:R6 is low, output 917 of R6:R7 is zero, and output 919 of R7:R8 is high.

Figure 15:
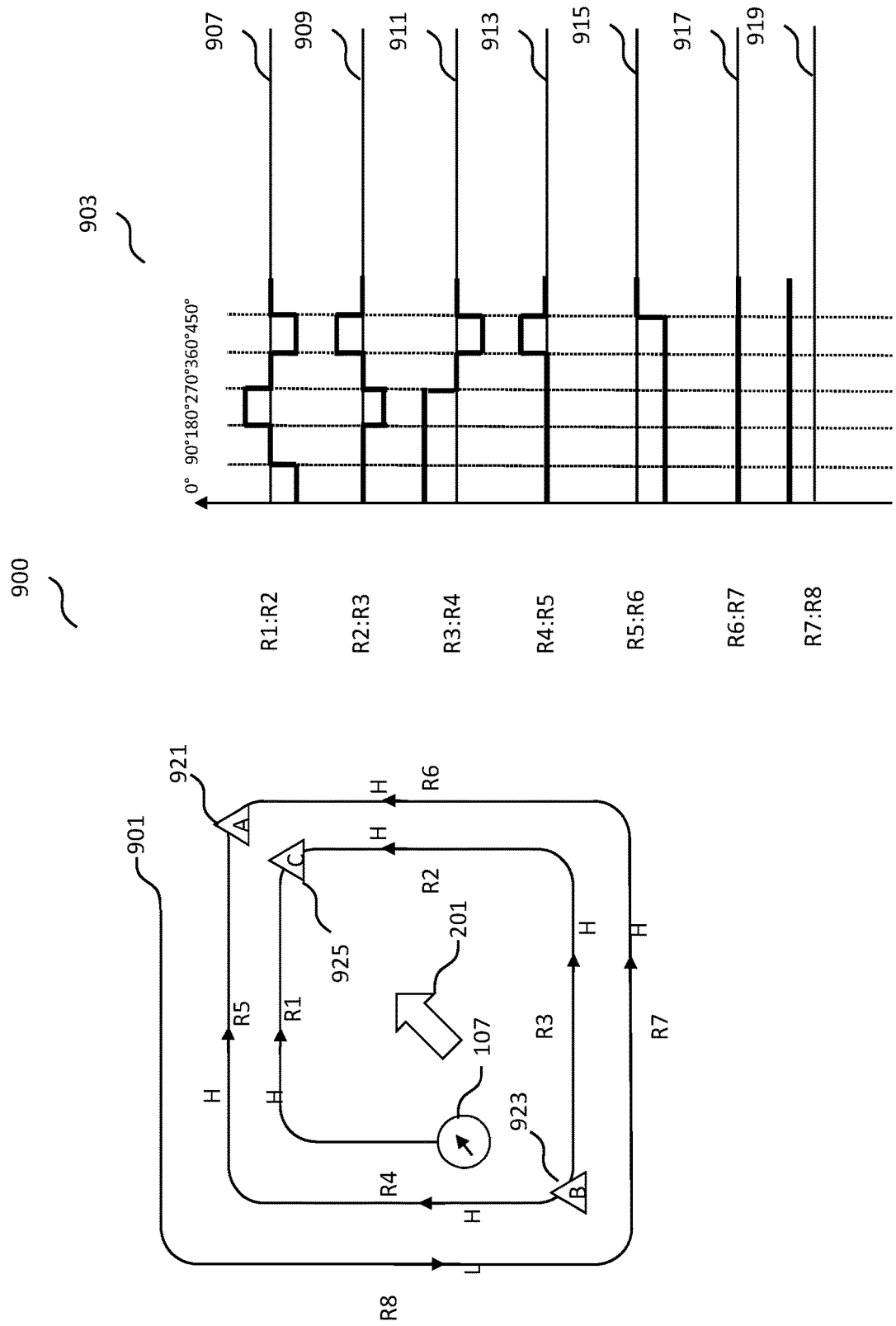

FIG. 15 shows the example 2 turn counter of FIG. 9 in a state where the magnetic field has rotated clockwise 450 degrees relative to the state corresponding to FIG. 10. In FIG. 15, the first domain wall 921 is shifted past R5, the second domain wall 923 is shifted past R3, and the third domain wall 925 is shifted past R1. In FIG. 15, magnetoresistive element R8 has a low resistance, and magnetoresistive elements R1, R2, R3, R4, R5, R6, and R7 have high resistances. As shown by output graph 903, output 907 of R1:R2 is zero, output 909 of R2:R3 is zero, output 911 of R3:R4 is zero, output 913 of R4:R5 is zero, output 915 of R5:R6 is zero, output 917 of R6:R7 is zero, and output 919 of R7:R8 is high.

Figure 16:
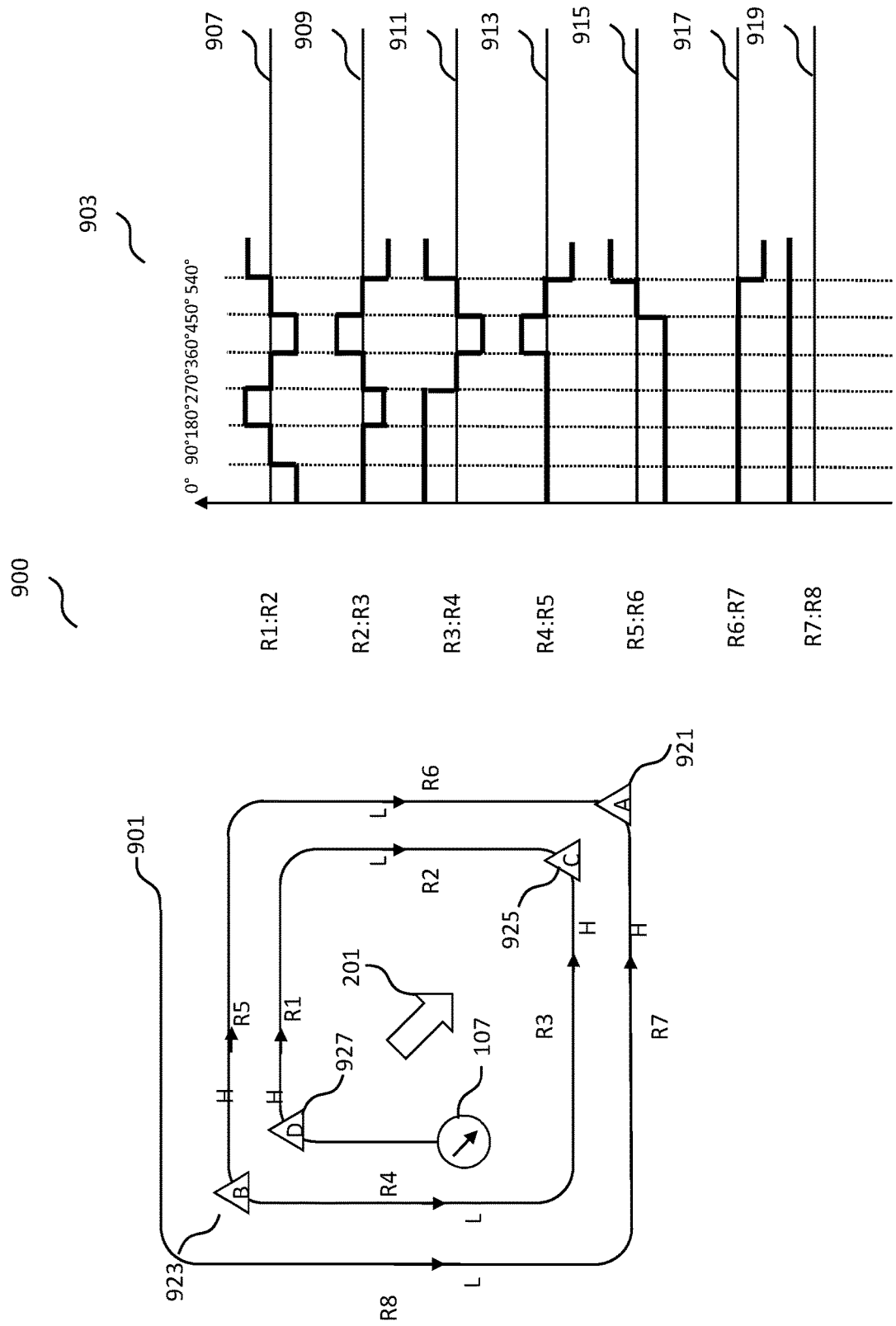

FIG. 16 shows the example 2 turn counter of FIG. 9 in a state where the magnetic field has rotated clockwise 540 degrees relative to the state corresponding to FIG. 10. In FIG. 16, the first domain wall 921 is shifted past R6, the second domain wall 923 is shifted past R4, the third domain wall 925 is shifted past R2, and a fourth domain wall 927 is generated. In FIG. 16, magnetoresistive elements R2, R4, R6, and R8 have low resistances, and magnetoresistive elements R1, R3, R5, and R7 have high resistances. As shown by output graph 903, output 907 of R1:R2 is high, output 909 of R2:R3 is low, output 911 of R3:R4 is high, output 913 of R4:R5 is low, output 915 of R5:R6 is high, output 917 of R6:R7 is low, and output 919 of R7:R8 is high.

Figure 17:
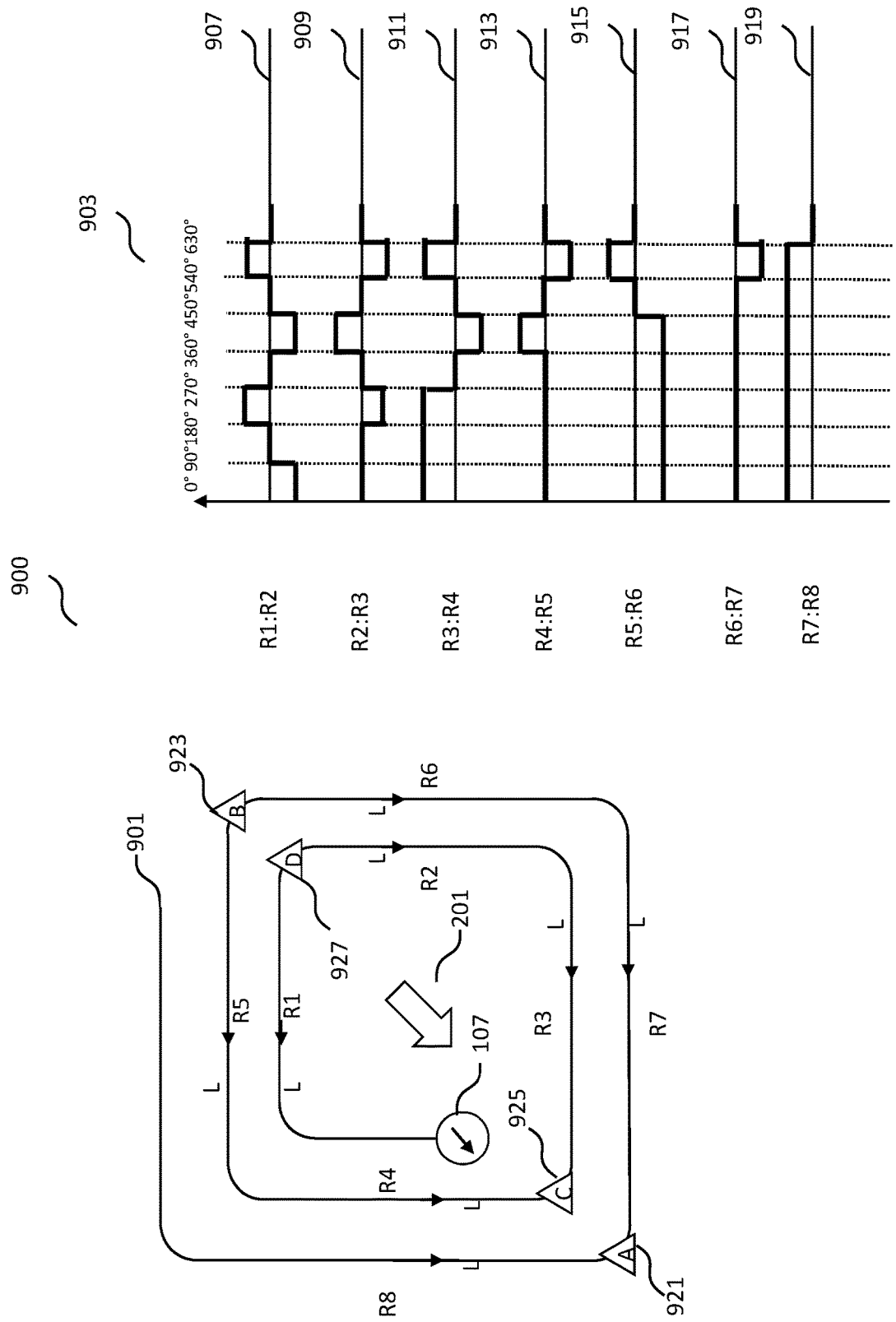

FIG. 17 shows the example 2 turn counter of FIG. 9 in a state where the magnetic field has rotated clockwise 630 degrees relative to the state corresponding to FIG. 10. In FIG. 17, the first domain wall 921 is shifted past R7, the second domain wall 923 is shifted past R5, the third domain wall 925 is shifted past R3, and the fourth domain wall 927 is shifted past R1. In FIG. 17, magnetoresistive elements R1-R8 have low resistances. All outputs 907, 909, 911, 913, 915, 917, and 919 are zero.

Figure 18:
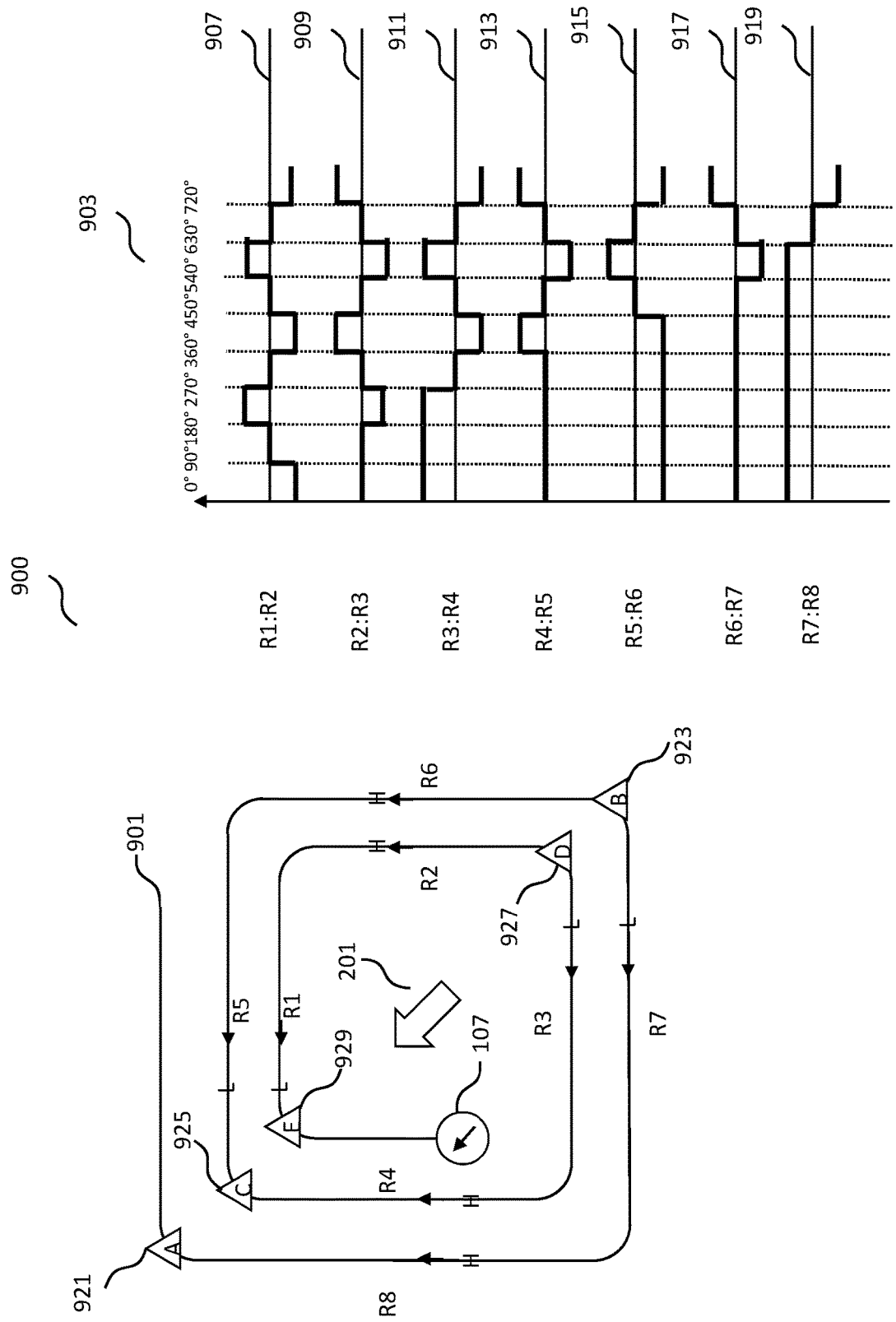

FIG. 18 shows the example 2 turn counter of FIG. 9 in a state where the magnetic field has rotated clockwise 720 degrees (2 turns) relative to the state corresponding to FIG. 10. In FIG. 18, the first domain wall 921 is shifted past R8, the second domain wall 923 is shifted past R6, the third domain wall 925 is shifted past R4, the fourth domain wall 927 is shifted past R2, and a fifth domain wall 929 is generated. In FIG. 18, magnetoresistive elements R1, R5, R3, and R7 have low resistances, and magnetoresistive elements R2, R4, R6, and R8 have high resistances. As shown by output graph 903, output 907 of R1:R2 is low, output 909 of R2:R3 is high, output 911 of R3:R4 is low, output 913 of R4:R5 is high, output 915 of R5:R6 is low, output 917 of R6:R7 is high, and output 919 of R7:R8 is low. Additional clockwise rotations (beyond 2 turns) could, in some embodiments, cause an overdrive situation where the outputs would no longer be unique.

The outputs shown in FIGS. 9-18 show unique output combinations for each consecutive 90 clockwise turn. In addition to detecting turns in a single direction, the multiturn sensor can detect bidirectional rotations in the magnetic field with 180 degree accuracy, for example, as illustrated below with respect to FIG. 19 and FIG. 20. The output graph can be decoded to reflect the accumulated number of bidirectional rotations.

Figure 19:
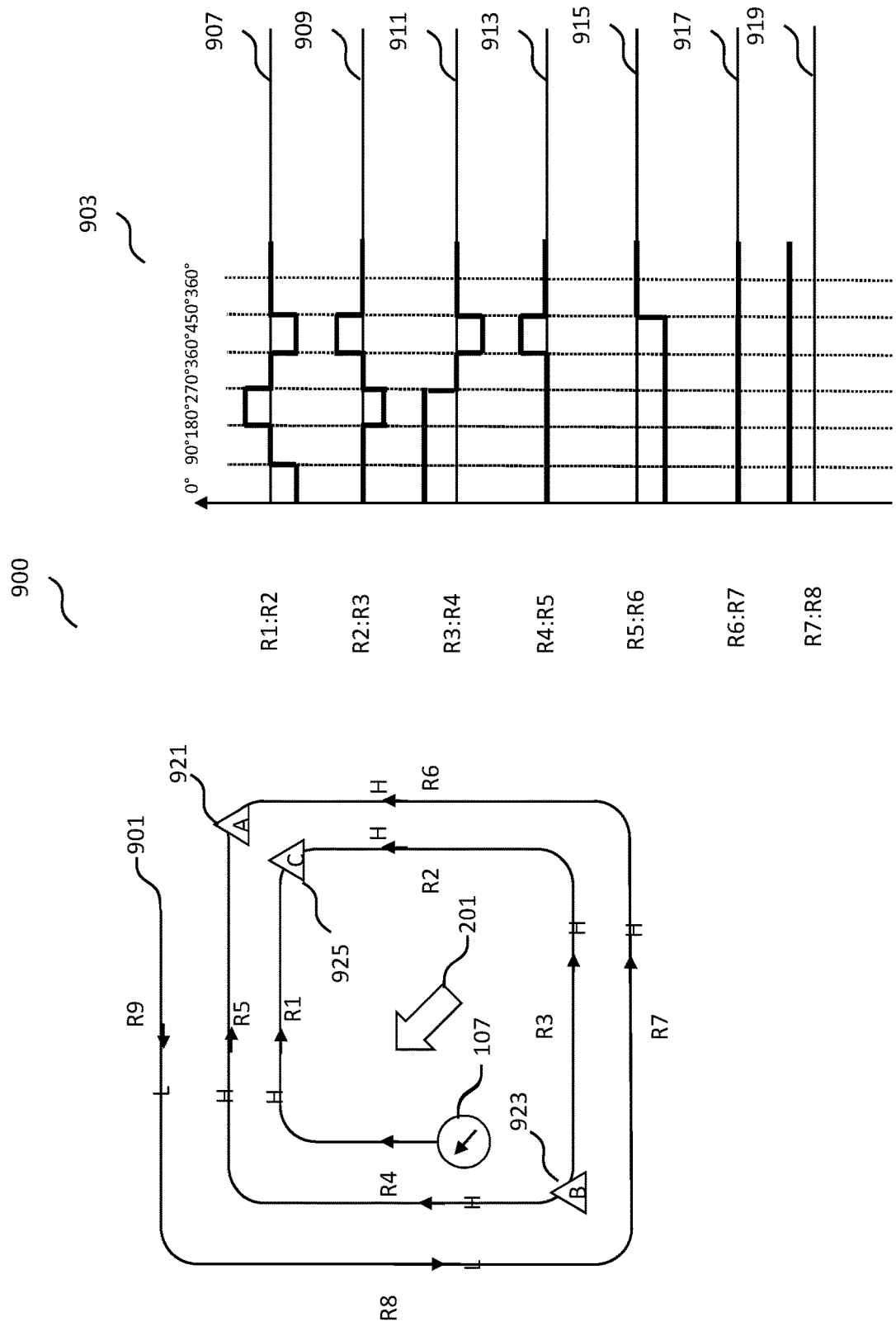
FIGS. 19-20 show an example of progressively reversing turn states following the turn state of FIG. 15 in accordance with an embodiment.

FIG. 19 shows the example 2 turn counter in a state where the magnetic field has rotated counterclockwise 90 degrees relative to the state corresponding to FIG. 15 to have an accumulated rotation of 360 degrees relative to the state corresponding to FIG. 10. The state of the domain walls, magnetoresistive element resistance, and compared outputs are the same as described for FIG. 15.

Figure 20:
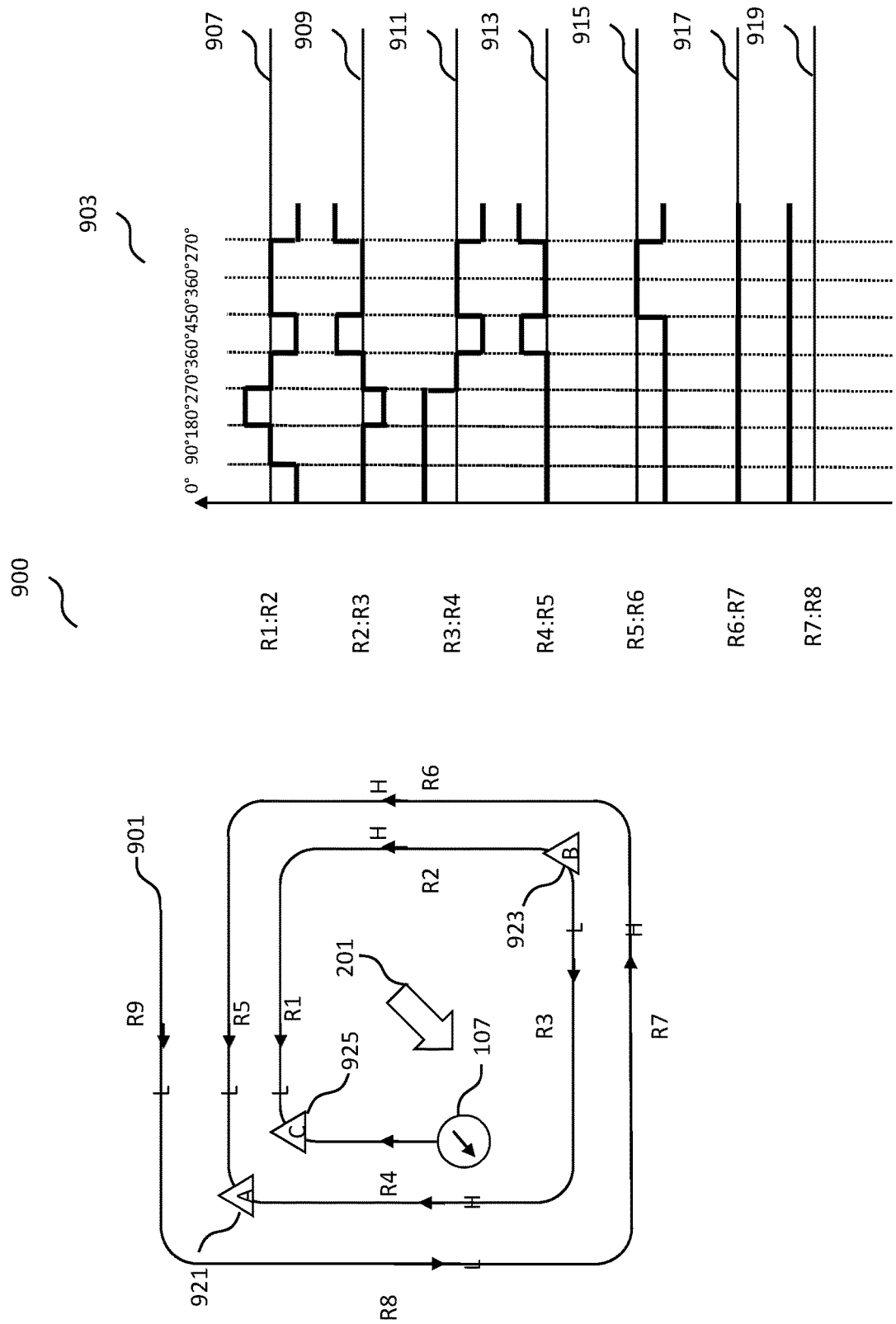

FIG. 20 shows the example 2 turn counter in a state where the magnetic field has rotated counterclockwise 90 degrees relatively to the state corresponding to FIG. 19 to have an accumulated rotation of 270 degrees relative to the state corresponding to FIG. 10. In FIG. 20, the first domain wall 921 is shifted between R4 and R5, the second domain wall 923 is shifted between R2 and R3, and the third domain wall 925 shifted between R1 and the DWG 107. In FIG. 20, magnetoresistive elements R1, R3, R5, and R8 have low resistances, and magnetoresistive elements R2, R4, R6, and R7 have high resistances. As shown by output graph 903, output 907 of R1:R2 is low, output 909 of R2:R3 is high, output 911 of R3:R4 is low, output 913 of R4:R5 is high, output 915 of R5:R6 is low, output 917 of R6:R7 is zero, and output 919 of R7:R8 is high.

FIG. 19 and FIG. 20 show that a 180 degree resolution is achieved when reversing directions. Accordingly, as shown by the examples in FIG. 19 and FIG. 20, the multiturn sensor can achieve a 180 degree resolution in use in both the clockwise and counterclockwise directions.

Figure 21:
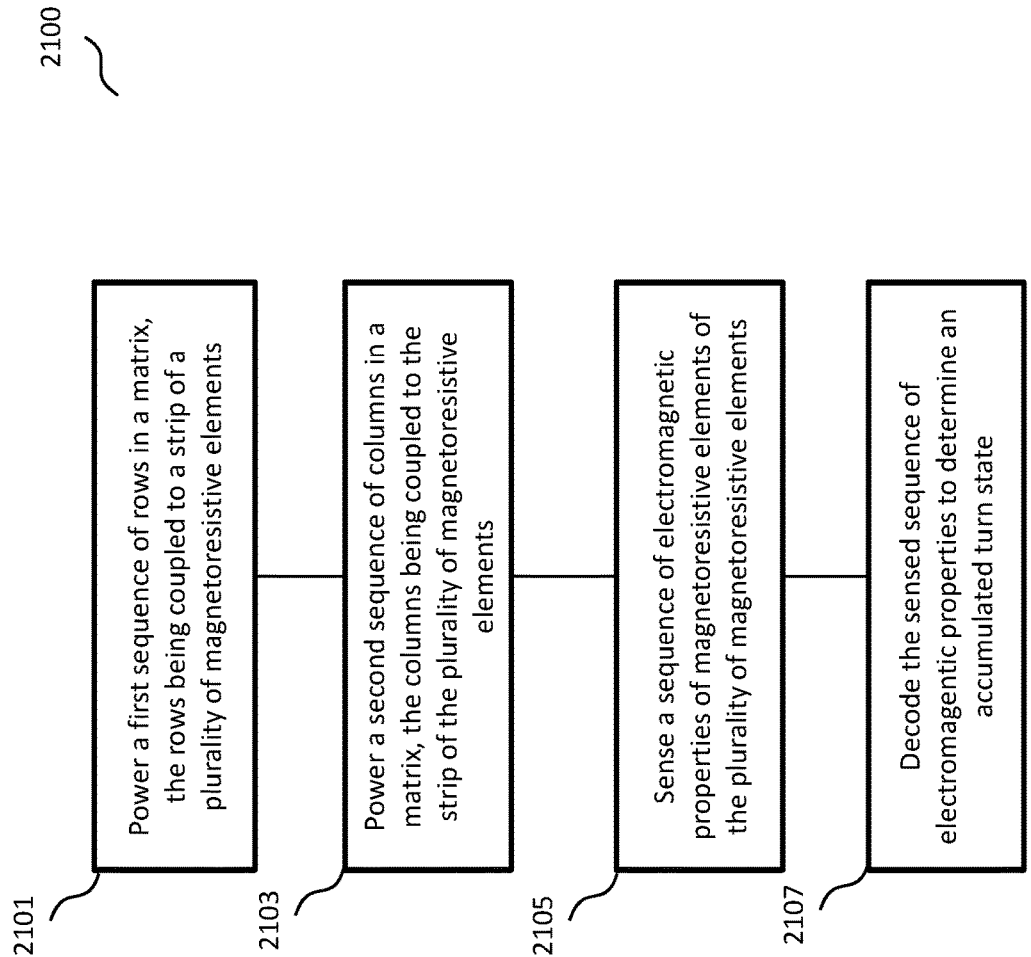
FIG. 21 shows an example method for reading a state of a giant magnetoresistance sensor according to an embodiment.

FIG. 21 shows an example method 2100 for reading a state of a giant magnetoresistance sensor. The method can be used to sequentially select, power, and measure individual segments in a GMR sensor to determine an accumulated turn state. The method can be implemented, for example, using the circuits shown in FIG. 6 and in FIG. 7.

At block 2101, a first sequence of rows in a matrix is powered, the rows being coupled to a magnetic strip of a plurality of magnetoresistive elements. Powering can include providing a voltage, current (e.g., current source 603 in FIG. 6 and in FIG. 7), or a reference value. A first example of a sequence for four rows of switches ABCD (e.g., row switches 609 in FIGS. 6 and 609 in FIG. 7) includes [0111, 0111, 1011, 1011, 1101, 1101, 1110, 1110, 1101, 1101, 1011, 1011, 0111, 0111] where 0 represents a first switch state and 1 represents a second switch state. The first switch state can cause the switch to electrically couple to a grounding or reference voltage. The second switch state can cause the switch to electrically couple to a different circuit pathway, such as to output of amplifier 605 of FIG. 6 and FIG. 7. Other examples of sequences include parts of the first example, reordered permutations of the first example, the first example with inverted values, the first example with more or fewer combinations in the sequence, and the second example with different values.

At block 2103, a second sequence of columns in a matrix is powered, the columns being coupled to the magnetic strip of the plurality of magnetoresistive elements. A second example of a sequence for four columns WXYZ (e.g., column switches 607 in FIGS. 6 and 607 in FIG. 7) includes [1000, 0100, 0100, 1000, 1000, 0100, 0100, 0001, 0001, 0010, 0010, 0001, 0001, 0010] where 0 represents an open switch and 1 represents a closed switch. Other examples of sequences include parts of the second example, reordered permutations of the second example, the second example with inverted values, the second example with more or fewer combinations in the sequence, and the second example with different values.

At block 2105, a sequence of electromagnetic properties of magnetoresistive elements of the plurality of magnetoresistive elements is sensed. The electromagnetic properties can be indicative of resistance. In some embodiments, the first sequence and the second sequence are such that a sensing circuit is configured to make a measurement of a sequence of individual, selected magnetoresistive elements. In some embodiments, sequence of individual, selected magnetoresistive elements are the sequence of magnetoresistive elements in the magnetic strip as arranged in the magnetic strip. In some embodiments, the sequence of individual, selected magnetoresistive elements include the magnetoresistive elements in the magnetic strip so that a unique output is made for 180 turn resolutions. In some embodiments, electromagnetic properties can be a resistance, a voltage, a current, or a comparison of a resistance, voltage, or current. In some embodiments, the electromagnetic properties can be sensed by a voltmeter, ammeter, ohmmeter, sample and hold circuit, comparator, or analog to digital converter.

At block 2107, the sensed sequence of electromagnetic properties is decoded to determine an accumulated turn state. The decoding can be done for example, by using a lookup table of magnetoresistive element values and corresponding turn states. As another example, a combination of turn states (e.g., as shown in the output graphs 903 of FIGS.

9-20) can be used to identify the accumulated turn state with 90 degree accuracy in one direction or 180 degree accuracy in two directions.

Figure 22:
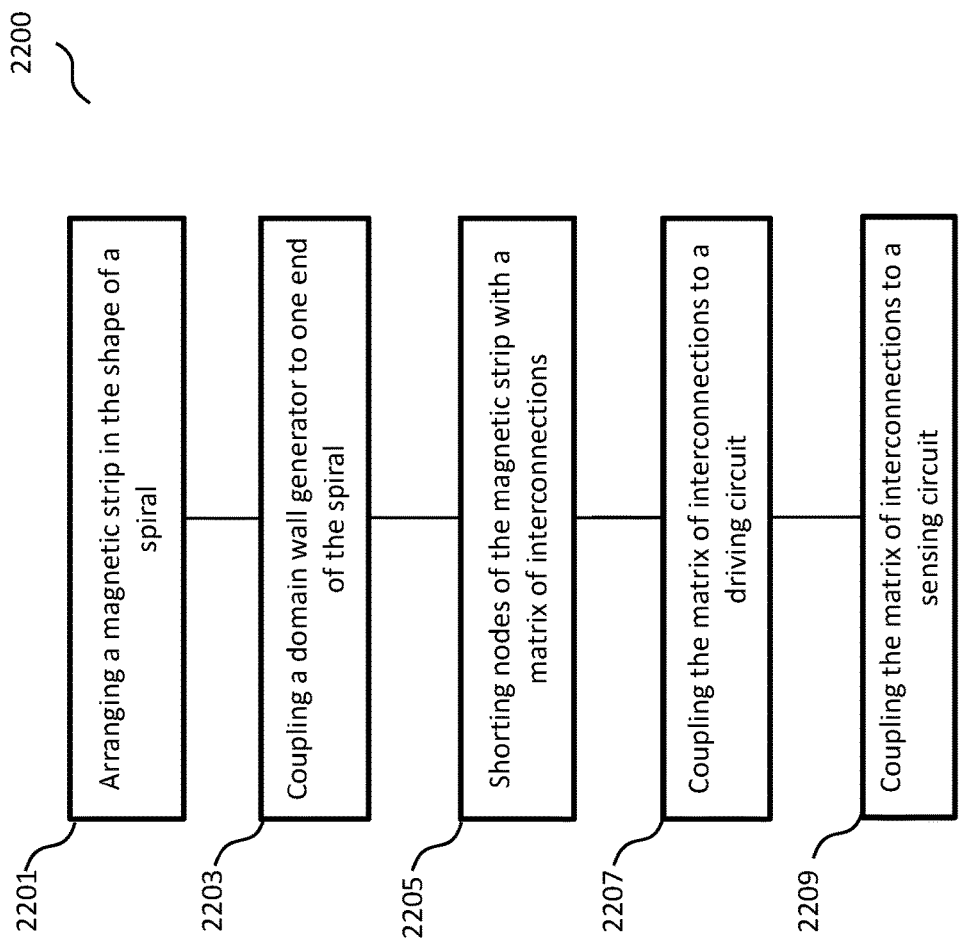
FIG. 22 shows an example method for making a multiturn sensor according to an embodiment.

FIG. 22 shows an example method 2200 for making a multiturn sensor, for example, any of the multiturn sensors and parts thereof as shown in FIGS. 1-8.

At block 2201, a magnetic strip is formed in the shape of spiral, for example, as shown in FIG. 1, FIG. 2, and FIG. 4. The spiral can have straight segments and rounded corners, and the segments can have a magnetically variable resistance as domain walls propagate through the segments.

At block 2203, a domain wall generator (such as domain wall generator 107 of FIG. 1) can be coupled to one end of the spiral. This can be part of the same processing step as forming the magnetic strip in certain embodiments.

At block 2205, nodes of the magnetic strip can be shorted with a matrix of interconnections, for example, as shown in FIG. 3 and in FIG. 4. In some embodiments, the nodes can be coupled to the rounded corners between the straight segments. The matrix can have rows and columns, wherein rows connect to first ends of the straight segments and wherein the columns connect to second ends of the straight segments.

At block 2207, the matrix of interconnections can be coupled to a driving circuit, such as driving circuit 815 of FIG. 8. The driving circuit can couple to at least one of the rows and columns of the matrix. The driving circuit can include, for example, the current source 603 and amplifier 605 of FIG. 6 and FIG. 7.

At block 2209, the matrix of interconnections can be coupled to a sensing circuit. The sensing circuit can include, for example, the voltmeter 601 of FIG. 6. The sensing circuit can include, for example, the sample and hold circuits 701, 703 and the digitizer circuit 707 of FIG. 7. In some embodiments, additional components, such as those shown in FIG. 8, can be further coupled to the multiturn sensor.

The various features and processes described above may be implemented independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. For example, forming a magnetic strip in the shape of a spiral in block 2201 and coupling a domain wall generator to one end of the spiral in block 2203 can be performed in parallel during the same fabrication step. Blocks or states may be added to or removed from the disclosed example embodiments. The example systems and components described herein may be configured differently than described. For example, elements may be added to, removed from, or rearranged compared to the disclosed example embodiments. Various embodiments can apply different techniques for fabricating different types of electronic devices. Some embodiments apply to the fabrication of giant magnetoresistance sensors.

In the embodiments described above, apparatuses, systems, and methods for multiturn sensors are described in connection with particular embodiments. It will be understood, however, that the principles and advantages of the embodiments can be used for any other systems, apparatus, or methods that could benefit from a multiturn magnetic sensor. Although certain embodiments are described with reference to particular spiral shapes, a 2 turn sensor, particular types of magnetic properties, particular matrix dimensions, it will be understood that the principles and advantages described herein can be applied to a variety of applications using different spiral shapes, sensors capable of counting a different number of turns or partial turns, different types of magnetic properties, different matrix sizes (e.g., minimum of 3×3, minimum of 2×3, minimum of 3×2, minimum of 3×4, and larger). In certain embodiments, the spiral can have a minimum number of magnetoresistive elements, such as 3, 4, 5, 6, 7, 8, 9, or more. Although certain embodiments are described with reference to a circuit that includes a single driving circuit and a single sensing circuit, in some embodiments, multiple sensing circuits and driving circuits can operate through multiple matrixes on different parts of a spiral in parallel to more quickly decode the accumulated turn state. Moreover, while some circuit schematics are provided for illustrative purposes, other equivalent circuits can alternatively be implemented to achieve the functionality described herein.

The principles and advantages described herein can be implemented in various apparatuses. Examples of such apparatuses can include, but are not limited to, vehicles, motors, treadmills, flywheels, GPS systems, gates, population counters, consumer electronic products, parts of the consumer electronic products, electronic test equipment, etc. Consumer electronic products can include, but are not limited to, wireless devices, a mobile phone (for example, a smart phone), healthcare monitoring devices, vehicular electronics systems such as automotive electronics systems, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, a radio, a camcorder, a camera, a digital camera, a washer, a dryer, a washer/dryer, a copier, a facsimile machine, a scanner, a multi-functional peripheral device, a wrist watch, a clock, etc. Other apparatuses include anything with a movable or rotatable part where the amount of movement is measured. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or "connected", as generally used herein, refer to two or more elements that can be either directly connected, or connected by way of one or more intermediate elements. Additionally, the words "herein," "above," "below," and words of similar import, if and when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A system comprising:
    a multiturn counter configured to store a magnetic state associated with a number of accumulated turns of a magnetic field, the multiturn counter configured to count at least two turns, and the multiturn counter comprising:
        a giant magnetoresistance (GMR) track comprising a plurality of magnetoresistive elements electrically coupled in series with each other, the plurality of magnetoresistive elements comprising at least eight magnetoresistive elements, wherein the magnetic state stored by the plurality of magnetoresistive elements is configured to change in response to rotation of the magnetic field; and
        a matrix of electrical connections arranged to electrically connect magnetoresistive elements of the plurality of magnetoresistive elements to other magnetoresistive elements of the plurality of magnetoresistive elements, the matrix being at least three by three.

2. The system of claim 1, further comprising a driving and sensing circuit configured to select an individual magnetoresistive element of the plurality of magnetoresistive elements and to determine a measure of resistance of the individual magnetoresistive element.

3. The system of claim 2, further comprising a decoder configured to provide an output indicative of the number of accumulated turns of the magnetic field based the measure of resistance of the individual magnetoresistive element and respective measures of resistance of other magnetoresistive elements of the plurality of magnetoresistive elements.

4. The system of claim 1, wherein the GMR track is physically laid out in a spiral shape.

5. The system of claim 1, wherein the multiturn counter further comprises a domain wall generator coupled to one end of the plurality of magnetoresistive elements.

6. The system of claim 1, wherein the multiturn counter is configured to count N turns, the system further comprising:
    a number of sensing circuits, the number being less than 2 times N; and
    a plurality of switches configured to electrically couple an individual magnetoresistive element of the plurality of magnetoresistive elements to an individual sensing circuit of the number of sensing circuits.

7. The system of claim 4, wherein:
    the track has N magnetoresistive elements, where N is greater than or equal to 8;
    the GMR track has R physical connections to rows of electrical connections of the matrix of electrical connections;
    the track has C physical connections to columns of electrical connections of the matrix of electrical connections;
    the following equations are satisfied:

$N \leq (R+1)*(C+1)$; and $N \geq (R-1)*(C-1)$;

C is 3 or greater; and
    R is 3 or greater.

8. A system with multiturn magnetic sensing, the system comprising:
    a giant magnetoresistance (GMR) strip comprising a plurality of magnetoresistive elements electrically coupled in series with each other, the plurality of magnetoresistive elements together configured to store a state associated with an accumulated number of turns of a magnetic field, wherein the state stored by the plurality of magnetoresistive elements is configured to change in response to rotation of the magnetic field; and
    a driving and sensing circuit coupled to the GMR strip, the driving and sensing circuit configured to select an individual magnetoresistive element of the plurality of magnetoresistive elements to cause a voltage drop across the individual magnetoresistive element, and the driving and sensing circuit configured to provide an indication of a resistance of the individual magnetoresistive element.

9. The system of claim 8, further comprising a matrix of electrical connections coupled to a plurality of nodes on the GMR strip, wherein the driving and sensing circuit is coupled to the GMR strip via the matrix of electrical connections.

10. The system of claim 9, wherein the matrix comprises rows of electrical connections and columns of electrical connections, and the driving and sensing circuit is configured select a row of the rows and a column of the columns to select the individual magnetoresistive element.

11. The system of claim 9, wherein the matrix electrically connects magnetoresistive elements of the plurality of magnetoresistive elements to respective other magnetoresistive elements of the plurality of magnetoresistive elements.

12. The system of claim 8, further comprising a domain wall generator configured to propagate one or more domain walls through the GMR strip in response to a rotation of the magnetic field.

13. The system of claim 8, wherein the plurality of magnetoresistive elements comprise eight magnetoresistive elements.

14. The system of claim 8, wherein the GMR strip has a spiral shaped layout.

15. The system of claim 8, further comprising a decoder electrically connected to the driving and sensing circuit, the decoder configured to determine the state associated with the accumulated number of turns of the magnetic field and to provide an output indicative of the number of accumulated turns of the magnetic field.

16. The system of claim 8, wherein the driving and sensing circuit is configured to select different individual magnetoresistive elements from the plurality of magnetoresistive elements and to determine an indication of resistance of each of the different the individual magnetoresistive elements.

17. A method of multiturn magnetic sensing, the method comprising:
   storing, with a giant magnetoresistance (GMR) strip comprising a plurality of magnetoresistive elements electrically connected in series with each other, a state associated with an accumulated number of turns of a magnetic field, wherein the state stored by the plurality of magnetoresistive elements changes in response to rotation of the magnetic field;
   selecting an individual magnetoresistive element of the plurality of magnetoresistive elements to cause a voltage drop across the individual magnetoresistive element; and
   detecting a measure of resistance of the individual magnetic magnetoresistive element.

18. The method of claim 17, wherein said selecting comprises selecting a row of a plurality of rows of a matrix of electrical connections and a column of a plurality of columns of the matrix of electrical connections, wherein the matrix of electrical connections is coupled to a plurality of nodes on the GMR strip.

19. The method of claim 17, further comprising determining, with a decoder, the state associated with the accumulated number of turns of the magnetic field based at least partly on said detecting.

20. The method of claim 17, further comprising:
   selecting a different individual magnetoresistive element from the plurality of magnetoresistive elements to cause a voltage drop across the different individual magnetoresistive element; and
   detecting a measure of resistance of the different individual magnetoresistive element.

* * * * *